United States Patent
Kapoor et al.

(10) Patent No.: US 12,176,189 B2
(45) Date of Patent: Dec. 24, 2024

(54) EARLY WARNING SYSTEMS AND METHODS FOR DETERMINING CAPACITOR FAILURES

(71) Applicant: Lam Research Corporation, Fremont, CA (US)

(72) Inventors: Sunil Kapoor, Vancouver, WA (US); James Ludlow Allen, Jr., Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 450 days.

(21) Appl. No.: 17/602,735

(22) PCT Filed: Apr. 9, 2020

(86) PCT No.: PCT/US2020/027444
§ 371 (c)(1),
(2) Date: Oct. 8, 2021

(87) PCT Pub. No.: WO2020/214477
PCT Pub. Date: Oct. 22, 2020

(65) Prior Publication Data
US 2022/0172933 A1    Jun. 2, 2022

Related U.S. Application Data

(60) Provisional application No. 62/834,178, filed on Apr. 15, 2019.

(51) Int. Cl.
*H01J 37/32*    (2006.01)
*G01R 31/64*    (2020.01)

(52) U.S. Cl.
CPC ........ *H01J 37/32935* (2013.01); *G01R 31/64* (2020.01); *H01J 37/32183* (2013.01)

(58) Field of Classification Search
None
See application file for complete search history.

(56) References Cited

U.S. PATENT DOCUMENTS 4,375,051 A * 2/1983 Theall .............. H03H 7/40
327/518
5,195,045 A    3/1993 Keane et al.
(Continued)

FOREIGN PATENT DOCUMENTS

JP    2009-290865 A    12/2009
KR    10-2014-0059422 A    5/2014

OTHER PUBLICATIONS

ISR & Written Opinion PCT/US2020/027444, dated Jul. 29, 2020, 9 pages.

*Primary Examiner* — Nasima Monsur
(74) *Attorney, Agent, or Firm* — PENILLA IP, APC

(57) ABSTRACT

Early warning systems and methods for determining capacitor failures are described. One of the methods includes controlling a motor to further control a variable capacitor that is coupled to the motor to facilitate achieving a hard stop position or a home position of the variable capacitor for multiple times. Each time the motor is controlled to facilitate achieving the home position or the hard stop position, a number of steps that are taken by the motor are recorded. The numbers of steps are compared with each other to determine whether the variable capacitor has failed.

19 Claims, 12 Drawing Sheets

(56) References Cited

U.S. PATENT DOCUMENTS

| | | | |
|---|---|---|---|
| 6,313,584 B1 | 11/2001 | Johnson et al. | |
| 2011/0214811 A1* | 9/2011 | Ashida | C23F 1/08 |
| | | | 333/33 |
| 2015/0270793 A1* | 9/2015 | Monroe | H02P 1/022 |
| | | | 417/423.1 |
| 2017/0365907 A1* | 12/2017 | Kapoor | C23C 16/458 |
| 2018/0025930 A1* | 1/2018 | Augustyniak | H01J 37/32715 |
| | | | 438/798 |

* cited by examiner

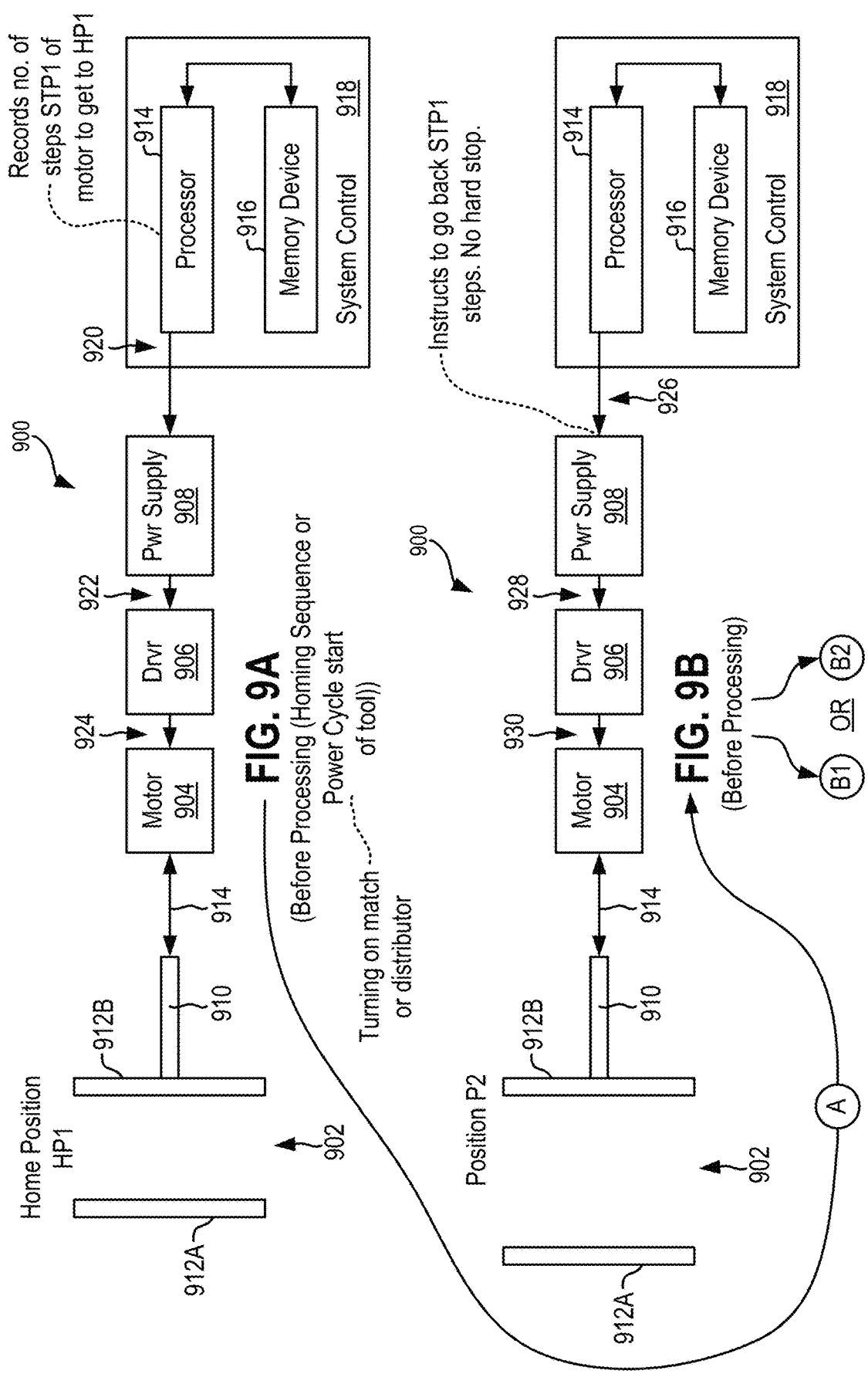

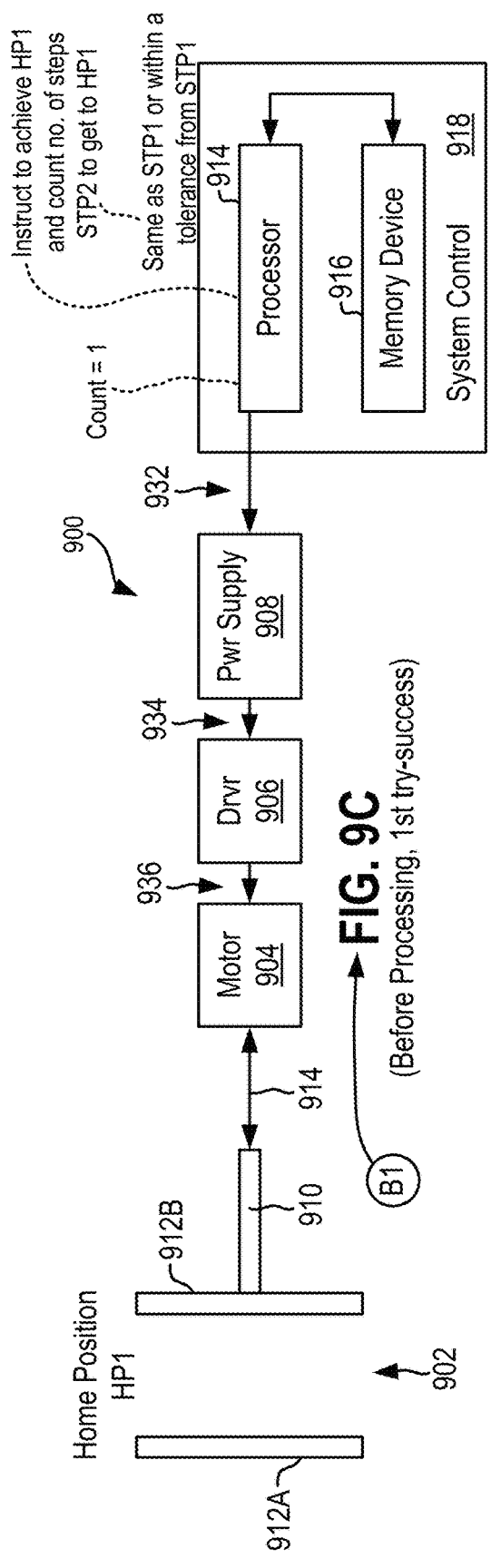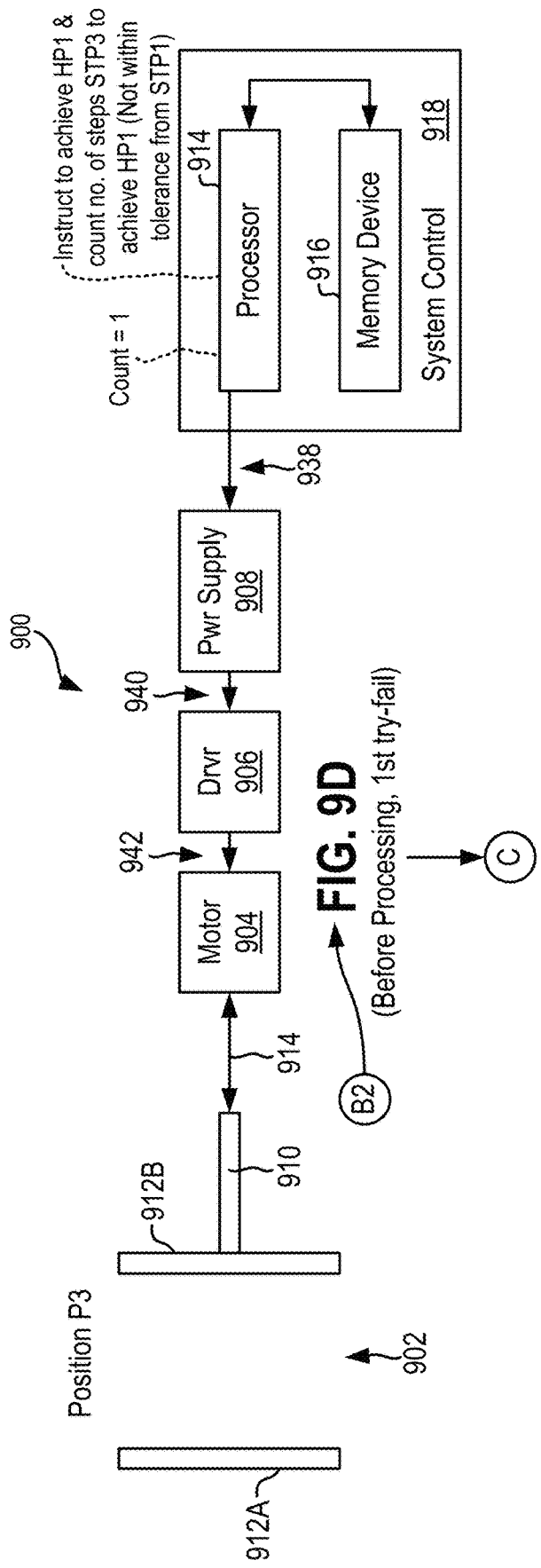

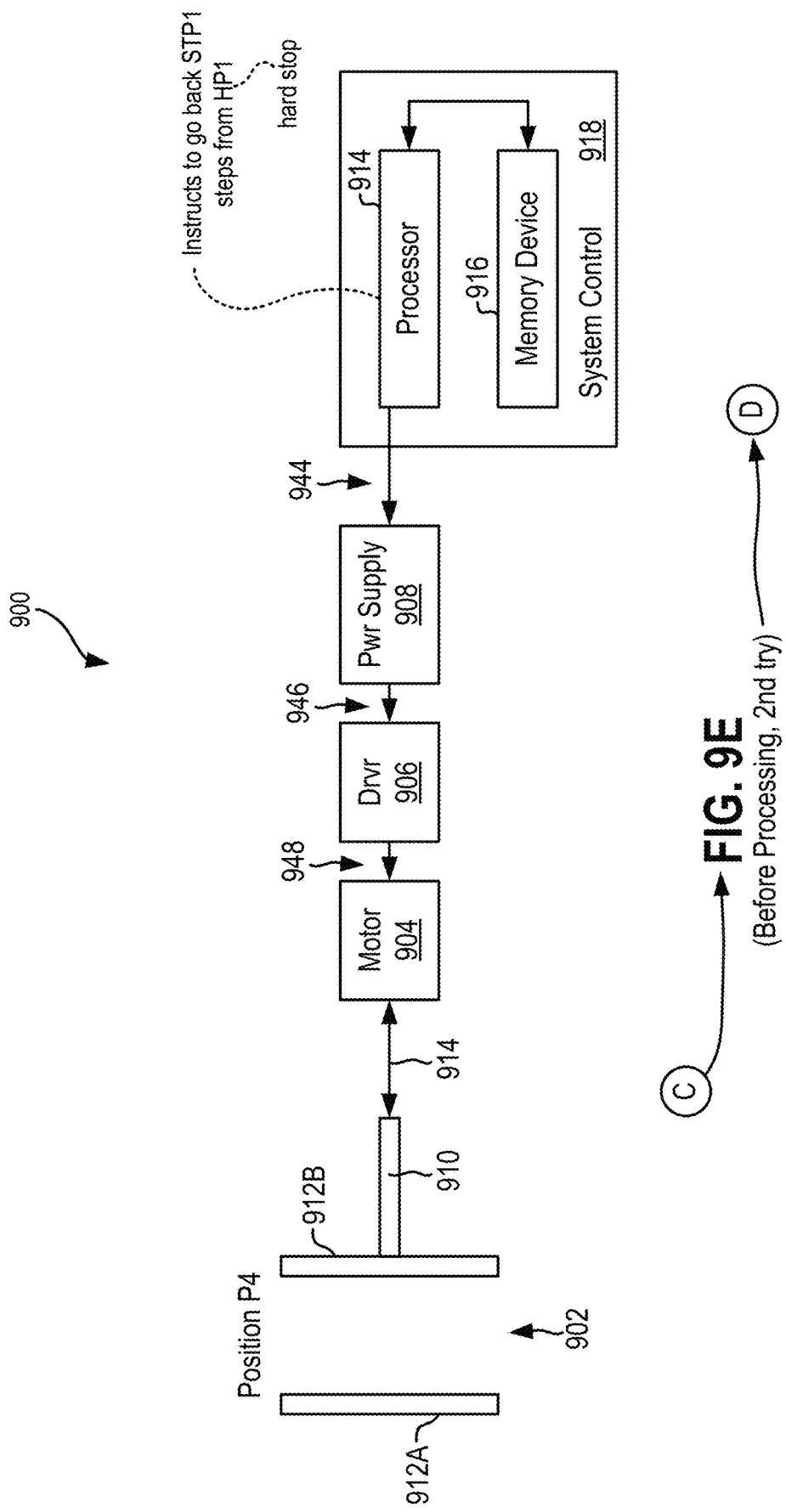

(Before Processing, 2nd try-fail)

EARLY WARNING SYSTEMS AND METHODS FOR DETERMINING CAPACITOR FAILURES

CLAIM OF PRIORITY

This application is a national stage filing of and claims priority, under 35 U.S.C. § 371, to PCT/US2020/027444, filed on Apr. 9, 2020, and titled "EARLY WARNING SYSTEMS AND METHODS FOR DETERMINING CAPACITOR FAILURES", which claims the benefit of and priority, under 35 U.S.C. § 119 (e), to Provisional Patent Application No. 62/834,178, filed on Apr. 15, 2019, and titled "EARLY WARNING SYSTEMS AND METHODS FOR DETERMINING CAPACITOR FAILURES", both of which are incorporated by reference herein in their entirety.

FIELD

The present embodiments relate to systems and methods for determining failure of a tuning capacitor before the tuning capacitor fails.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Some plasma tools include one or more radio frequency (RF) generators. The one or more RF generators are coupled to one or more plasma processing chambers or stations via one or more match networks. Substrates are placed in the plasma processing chambers or stations for processing.

Over time, a variety of components of the plasma tools may not function properly. When the components do not function properly, the substrates are not processed in a desirable manner.

It is in this context that embodiments described in the present disclosure arise.

SUMMARY

Embodiments of the disclosure provide systems and methods for determining failure of a tuning capacitor. It should be appreciated that the present embodiments can be implemented in numerous ways, e.g., a process, an apparatus, a system, a device, or a method on a computer-readable medium. Several embodiments are described below.

In semiconductor processing tools, an impedance matching circuit is used and an impedance match is achieved by using or tuning a variable capacitor of the impedance matching circuit. Also, in a multi-station semiconductor tool, such as a plasma enhanced chemical vapor deposition (PECVD) tool that has multiple stations, station balancing for power or deposition rate also uses a variable capacitor in a distribution system. These variable capacitors provide flexibility of impedance matching or power matching during processing of wafer. Failure of the variable capacitors during a process usually results in scrapping of one or more wafers and a long downtime of the impedance matching circuit or the distribution system. As an example, a common failure mode of a variable capacitor is damage to a lead screw of the variable capacitor due to wear out. It is important to re-grease the lead screw to protect it and elongate its life.

In one embodiment, a mechanism has been developed which provides an early warning of the failure of a variable capacitor before it fails. For example, a home position or a homing position of the variable capacitor is noted and compared with successive homing again. If the homing position remains the same, the variable capacitor is operating correctly but if more than 1 retry is applied to the variable capacitor to match the original homing position, it may be noted as a wearing sign associated with the variable capacitor. To illustrate, when 4 or more retries are applied to match the homing position, less than 5% life of the variable capacitor is left before its failure. This mechanism reduces chances of wafer scrapping and reduces the long downtime.

In some embodiments, a failure condition associated with a variable capacitor is determined. The failure condition is determined when a count exceeds a threshold. An example of the threshold include one, two three, four, five, six, or seven. The count exceeds the threshold when it is determined for greater than a predetermined number of times that there is a preset amount of discrepancy between a number of steps taken by a motor in achieving a hard stop position and a number of steps taken by the motor in achieving a home position. To illustrate, during a first try, it is determined by a processor that there is the preset amount of discrepancy between a number of steps taken by a motor in achieving a hard stop position and the number of steps taken by the motor in achieving the home position. The motor is coupled to the variable capacitor. During a second try, the processor determines that there is no discrepancy between a number of steps taken by a motor in achieving a hard stop position and the number of steps taken by the motor in achieving the home position. During a third try, it is determined by the processor that there is the discrepancy between a number of steps taken by a motor in achieving a hard stop position and the number of steps taken by the motor in achieving the home position. The count in this example is two because the processor keeps track of the number of tries or times for which the discrepancy is found. If the count exceeds the threshold, a warning is generated by the processor that the failure condition is achieved.

Some advantages of the herein described systems and methods include determining a failure condition associated with a variable capacitor. The failure condition is determined by controlling a motor to further control the variable capacitor to achieve a home position multiple times. A number of steps taken to achieve the home position for a first time is recorded. Also, after the first time, each time the motor is controlled, a number of steps taken by the motor to facilitate the achievement of the home position is recorded. The numbers of steps are compared with the number of steps taken to achieve the home position for the first time to determine whether the failure condition is achieved. For example if a first number of steps taken to facilitate achieving the home position is not within a tolerance from a second number of steps taken to achieve the home position and a third number of steps taken to facilitate achieving the home position is not within a tolerance from the second number of steps taken to achieve the home position, the failure condition is triggered. As such, it is determined that the variable capacitor has failed and the variable capacitor may be replaced with another variable capacitor. The replacement of the variable capacitor saves multiple wafers from being scrapped as a result of the failure in the variable capacitor.

Also, the determination of the failure condition saves time associated with unknowingly processing the wafers by using the failed variable capacitor.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 9A is a diagram of an embodiment of a system to illustrate a control of a motor to further control the variable capacitor to achieve a home position.

FIG. 9B is a diagram of an embodiment of the system of FIG. 9A to illustrate that the motor goes back a number of steps or operates in a reverse manner to go back the number steps after the variable capacitor achieves the home position.

FIG. 9C is a diagram of an embodiment of the system of FIG. 9A to illustrate that the motor is controlled to control the variable capacitor to be at the home position after the motor is controlled to step back the number of steps and the same or similar number of steps is recorded in achieving the home position.

FIG. 9D is a diagram of an embodiment of the system of FIG. 9A to illustrate that the motor is controlled to control the variable capacitor to be at the home position after the motor steps back the number of steps and another number of the steps are recorded in achieving the home position.

FIG. 9E is a diagram of an embodiment of the system of FIG. 9A to illustrate that the motor is operated to step back the number of steps or is controlled to operate in a reverse manner to go back the number of steps after the variable capacitor achieves a position in FIG. 9D.

DETAILED DESCRIPTION

The following embodiments describe systems and methods for determining failure of a tuning capacitor. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more plasma chambers or "reactors" (sometimes including multiple stations) that house one or more wafers and are suitable for wafer processing. Each plasma chamber houses one or more wafers for processing. The one or more plasma chambers maintain a wafer in a defined position or positions with or without motion, e.g. rotation, vibration, or other agitation, etc. A wafer that is being processed is transferred from one station to another within a plasma chamber. The processing occurs entirely at a single station or at any number of stations. While in process, each wafer is held in place by a pedestal, e.g., a wafer chuck, etc., and/or other wafer holding apparatus of the plasma chamber.

Figure 1:
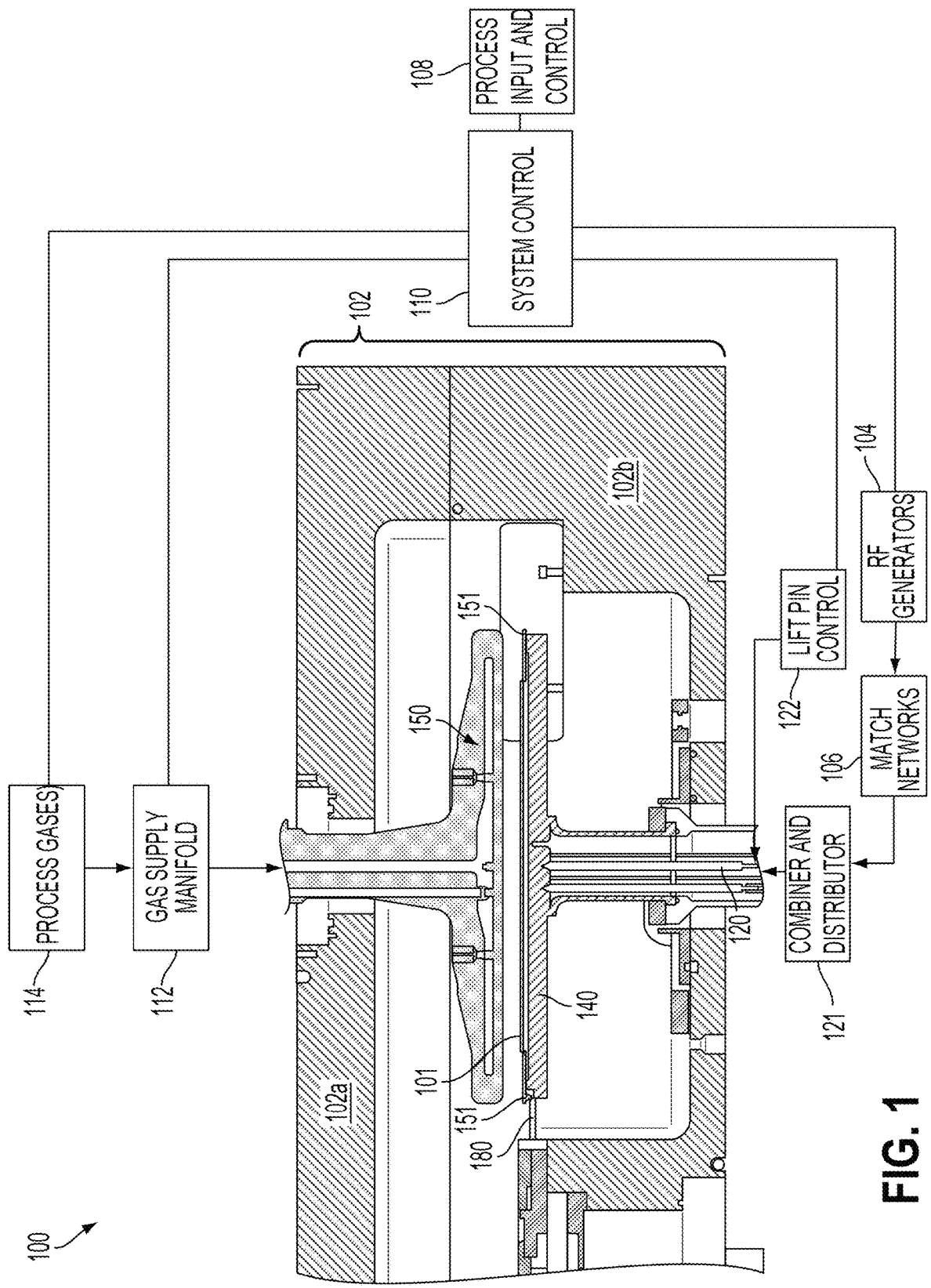
FIG. 1 illustrates a substrate processing system that is used to process a wafer.

FIG. 1 illustrates a substrate processing system 100, which is an example of the PECVD system used to process a wafer 101. The substrate processing system 100 includes a plasma chamber 102 having a lower chamber portion 102b and an upper chamber portion 102a. A center column is configured to support a pedestal 140, which in one embodiment includes a powered lower electrode. The pedestal 140 is electrically coupled to a combiner and distributor 121, which is further coupled to multiple match networks 106. The match networks 106 are coupled to multiple radio frequency (RF) generators 104.

The RF generators 104 are controlled by a system controller 110, e.g., a controller, etc. Examples of a system controller or a controller, as used herein, include a computing device that includes processor and a memory device. Examples of the computing device include a computer, a server, a tablet, and a smart phone. The processor, for example, is an application specific integrated circuit (ASIC), a programmable logic device (PLD), a central processing unit (CPU), or a microprocessor, etc. Examples of the memory device include a read-only memory (ROM), a random access memory (RAM), a redundant array of storage disks, a hard disk, a Flash memory, etc. The system controller 110 operates the substrate processing system 100 by executing a process input and control 108. The process input and control 108 includes process recipes, such as power levels, timing parameters, process gasses, mechanical movement of the wafer 101, etc., so as to deposit or form films over the wafer 101.

The center column is also shown to include lift pins 120, which are controlled by a lift pin control 122, which is a controller. The lift pins 120 are used to raise the wafer 101 from the pedestal 140 to allow an end-effector to pick the wafer 101 and to lower the wafer 101 after being placed by the end end-effector. The substrate processing system 100 further includes a gas supply manifold 112 that is connected to process gases 114, e.g., gas chemistry supplies from a facility, etc. Depending on the processing being performed, the system controller 110 controls a delivery of the process gases 114 via the gas supply manifold 112. The chosen gases are then flown into a shower head 150 and distributed in a space volume, e.g., a gap, etc., defined between a surface of the showerhead 150 that faces that wafer 101 and the pedestal 140.

Further, in some embodiments, the process gases 114 are premixed or not. Appropriate valving and mass flow control mechanisms are employed to ensure that the correct process gases are delivered during deposition and plasma treatment phases of the process. The process gases 114 exit the plasma chamber 102 via an outlet. A vacuum pump, e.g., a one or two stage mechanical dry pump, a turbomolecular pump, etc., draws process gases out and maintains a suitably low pressure within the plasma chamber 102 by a close loop controlled flow restriction device, such as a throttle valve or a pendulum valve.

Also shown is a carrier ring 151 that encircles an outer region of the pedestal 140. The carrier ring 151 sits over a carrier ring support region that is distal from a center of the pedestal 140 and is a step down from a wafer support region. The wafer support region is proximate to the center of the pedestal 140. The carrier ring 151 includes an outer edge side of its disk structure, e.g., outer radius, etc., and a wafer edge side of its disk structure, e.g., inner radius, etc., that is closest to where the wafer 101 sits. The wafer edge side of the carrier ring 151 includes a plurality of contact support structures which lift the wafer 101 when the carrier ring 151 is lifted by multiple spider forks 180. The carrier ring 151 is therefore lifted along with the wafer 101 and is rotated to another station, e.g., in a multi-station system.

In an embodiment, an upper electrode within the showerhead 150 is coupled to a ground potential when RF power is supplied from the RF generators 104 to the lower electrode within the pedestal 140.

In one embodiment, instead of the pedestal 140 being electrically coupled to the RF generators 104 via the match networks 106, the upper electrode within the showerhead 150 is coupled to the RF generators 104 via multiple match networks for receiving power from the RF generators 104 and the lower electrode within the pedestal 140 is coupled to the ground potential.

In an embodiment, the upper electrode within the showerhead 150 is coupled to one or more RF generators via corresponding one or more match networks for receiving power from the RF generators. Also, the lower electrode within the pedestal 140 is coupled to the RF generators 104 via the combiner and distributor 121 and the match networks 106.

In some embodiments, the RF generators 104 generate RF signals having different frequencies, e.g., one of the RF generators 104 generates an RF signal having a low frequency and another one of the RF generators 104 generates an RF signal having a high frequency, which is higher than the low frequency.

Figure 2:
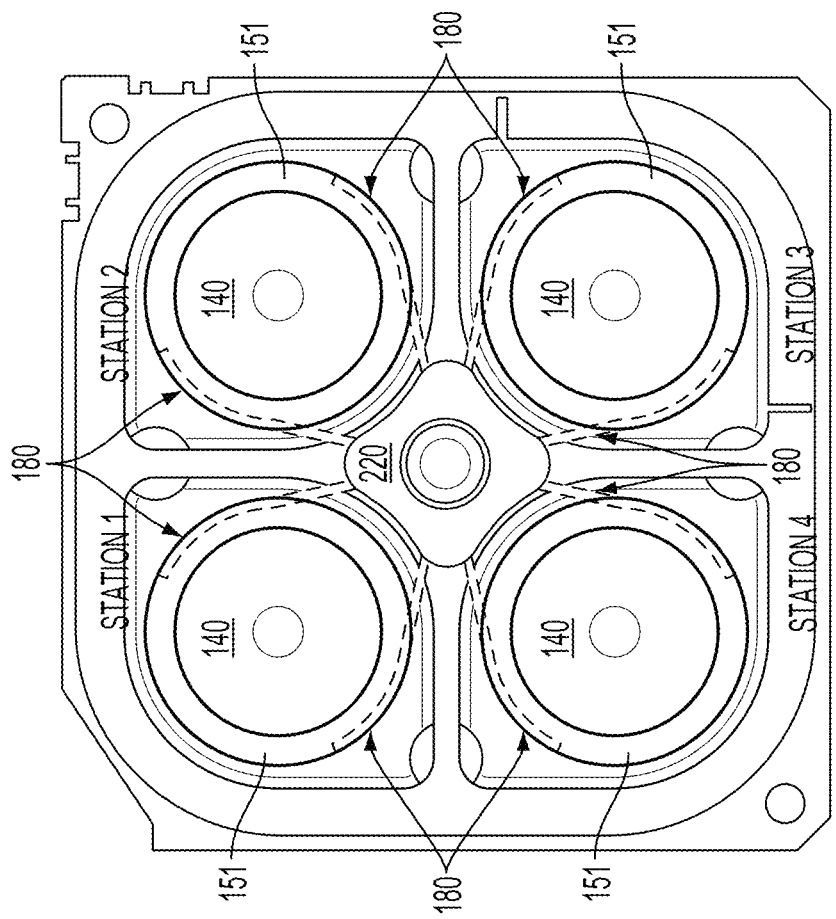
FIG. 2 illustrates a top view of a multi-station processing tool, where four processing stations are provided.

FIG. 2 illustrates a top view of a multi-station processing tool, where four processing stations, which are station 1, station 2, station 3, and station 4, are provided. Carrier rings within the four stations are accessed by the spider forks 180. In one embodiment, there is no isolation wall or other mechanism to isolate one station from another. Each spider fork 180 includes a first and second arm, each of which is positioned around a portion of each side of the pedestal 140. In this view, the spider forks 180 are drawn in dash-lines, to convey that they are below the carrier ring 151. The spider forks 180, using an engagement and rotation mechanism 220, which includes a spindle, to raise up and lift the carrier rings 151 from the pedestals 140 of the stations 1 through 4 simultaneously, and then rotate the carrier rings 151 between any two adjacent ones of the stations 1 through 4 before lowering the carrier rings 151. During the rotation, at least one of the carrier rings 151 supports the wafer 101 to a next station so that further plasma processing, treatment and/or film deposition takes place on the wafer 101.

Figure 3:
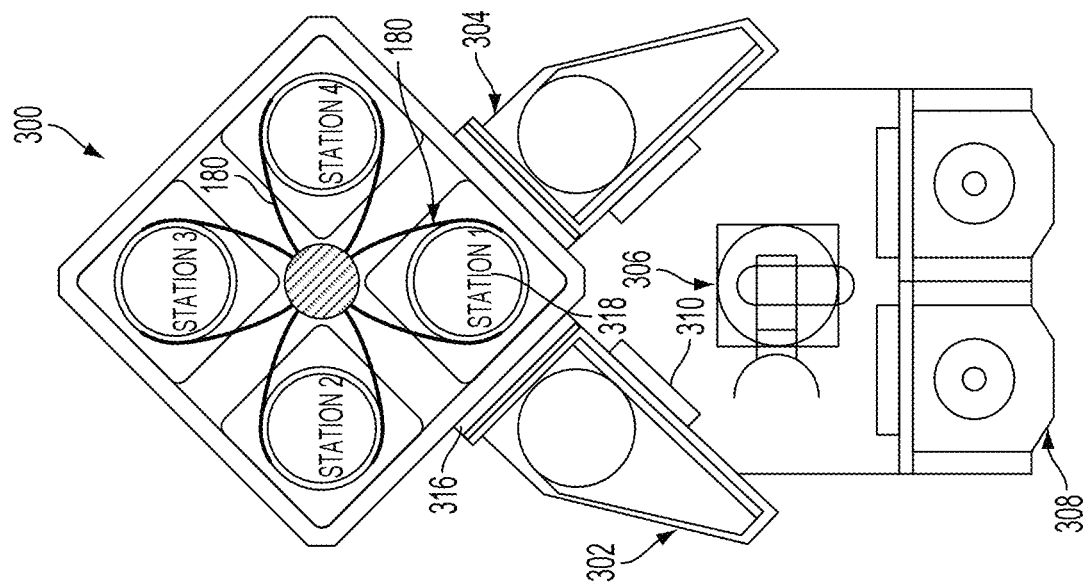
FIG. 3 shows a schematic view of an embodiment of a multi-station processing tool with an inbound load lock and an outbound load lock.

FIG. 3 shows a schematic view of an embodiment of a multi-station processing tool 300 with an inbound load lock 302 and an outbound load lock 304. A robot 306, at atmospheric pressure, moves a substrate, e.g., the wafer 101, etc., from a cassette loaded through a pod 308 into the inbound load lock 302 via an atmospheric port 310. The inbound load lock 302 is coupled to a vacuum source (not shown) so that when the atmospheric port 310 is closed, the inbound load lock 302 is pumped down. The inbound load lock 302 also includes a chamber transport port 316 interfaced with one of the stations 1 through 4. Thus, when the chamber transport 316 is open, another robot (not shown) moves the wafer 101 from the inbound load lock 302 to the pedestal 140 of the station 1 for processing.

In some embodiments, a low pressure environment is maintained in an enclosure that encloses the stations 1 through 4 so that substrates are transferred using the carrier ring 151 among the stations 1 through 4 without experiencing a vacuum break and/or air exposure. Each of the stations 1 through 4 includes a process station substrate holder and process gas delivery line inlets.

The spider forks 180 transfer substrates among the stations 1 through 4. The spider forks 180 rotate and enable transfer of the wafer 101 from one of the stations 1 through 4 to another one of the stations 1 through 4. The transfer occurs by enabling the spider forks 180 to lift the carrier rings 151 from an outer undersurface, which lifts the wafer 101, and rotates the wafer 101 and the carrier ring 151 together to the next station. In one configuration, the spider forks 180 are made from a ceramic material to withstand high levels of heat during processing.

In various embodiments, a number of stations other than four is used. For example, three or two or five plasma processing stations are used to process the wafer 101.

Figure 4:
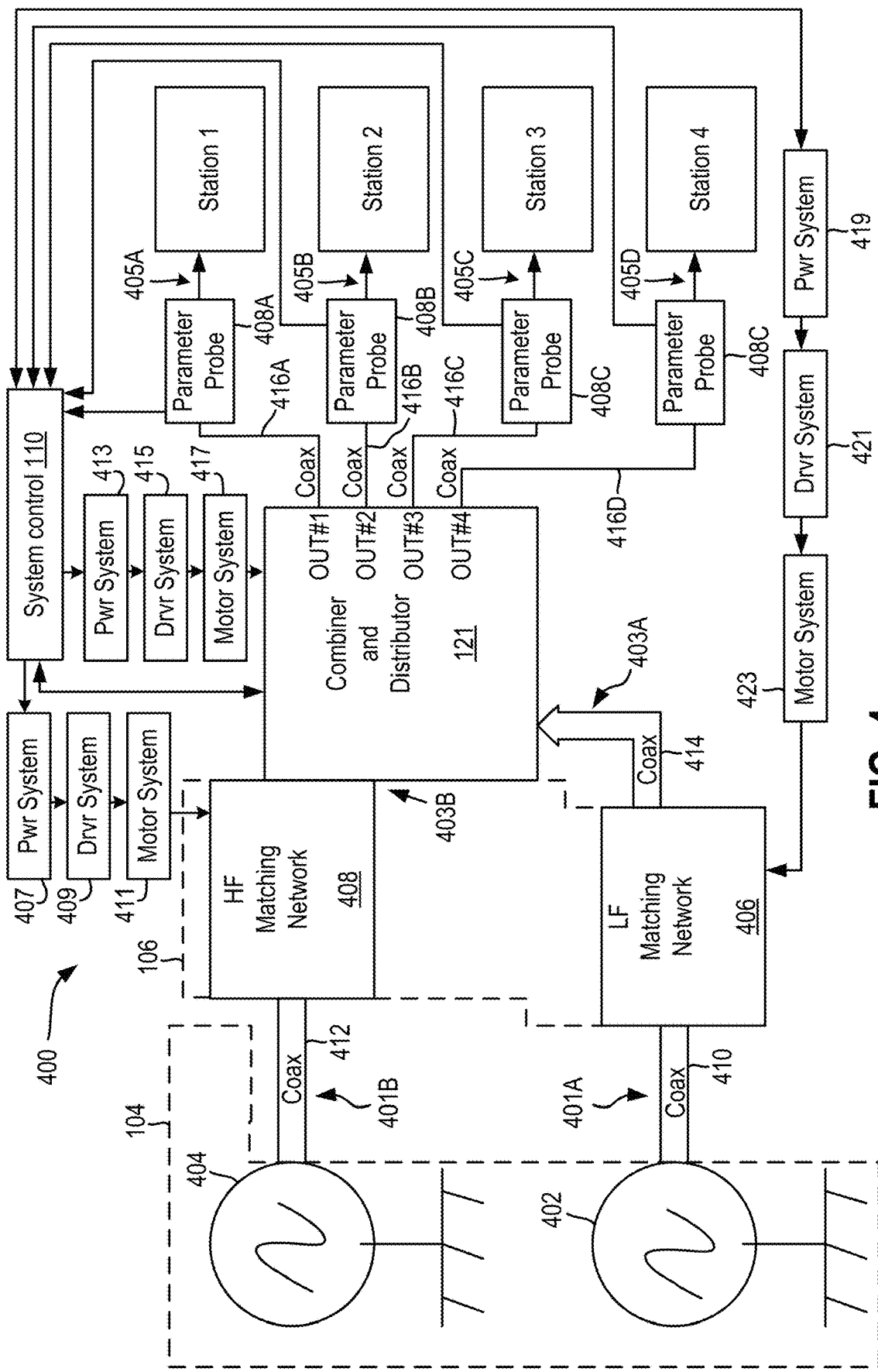
FIG. 4 is a diagram of an embodiment of a system for illustrating use of a combiner and distributor in combining and distributing radio frequency (RF) power to the stations.

FIG. 4 is a diagram of an embodiment of a system 400, such as a plasma tool, for illustrating use of the combiner and distributor 121 in combining and distributing RF power to the stations 1 through 4. The system 400 includes a low frequency generator 402 and a high frequency generator 404. An example of the high frequency generator 404 includes an RF generator having an operating frequency of 13 megahertz (MHz) or 27 MHz or 60 MHz. An example of the low frequency generator 402 includes a generator having an operating frequency of 2 MHz or 400 kilohertz (kHz).

The system 400 further includes a low frequency matching network 406 and a high frequency matching network 408. An input of the low frequency matching network 406 is coupled to an output of the low frequency generator 402 via a coaxial cable 410 and an input of the high frequency matching network 408 is coupled to an output of the high frequency generator 404 via another coaxial cable 412.

A matching network includes a circuit having one or more circuit components, such as one or more capacitors, one or more inductors, and/or one or more resistors. As an example, one circuit component is coupled to another circuit component in series or in parallel. The capacitors include variable capacitors or fixed capacitors or a combination of variable and fixed capacitors.

An output of the low frequency matching network 406 is coupled via a coaxial cable 414 to the combiner and distributor 121 and an output of the high frequency matching network 438 is coupled to the combiner and distributor 121. For example, there is no coaxial cable coupling the output of the high frequency matching network 408 to the input of the combiner and distributor 121. As another example, a coaxial cable couples the output of the high frequency matching network 408 to the input of the combiner and distributor 121.

A first output OUT #1 of the combiner and distributor 121 is coupled via a coaxial cable 416A to the station 1, e.g., the showerhead 150 of the station 1 or the pedestal 140 of the station 1, etc. Moreover, a second output OUT #2 of the combiner and distributor 121 is coupled via a coaxial cable 416B to the station 2, e.g., the showerhead 150 of the station 2 or the pedestal 140 of the station 2, etc. A third output OUT #3 of the combiner and distributor 121 is coupled via a coaxial cable 416C to the station 3, e.g., the showerhead 150 of the station 3 or the pedestal 140 of the station 3, etc. Moreover, a fourth output OUT #4 of the combiner and distributor 121 is coupled via a coaxial cable 416D to the station 4, e.g., the showerhead 150 of the station 4 or the pedestal 140 of the station 4, etc.

A parameter probe 408A is coupled to the OUT #1, a parameter probe 408B is coupled to the OUT #2, a parameter probe 408C is coupled to the OUT #3, and a parameter probe 408D is coupled to the OUT #4. The parameter probes 408A through 408D are coupled to the system controller 110, which is further coupled to the combiner and distributor 121. Examples of a parameter probe include a complex voltage and current sensor, a complex voltage sensor, a complex current sensor, an impedance sensor, a direct current (DC) bias voltage sensor, a complex power probe, etc.

The system 400 further includes a power system 407, a driver system 409, and a motor system 411. In an embodiment, a driver system is sometimes referred to herein as a drive system component. An example of a power system, as described herein, includes a DC power supply or an alternating current (AC) power supply. Also, an example of a driver system, as described herein, includes one or more transistors that are coupled to each other. An example of a motor system, as described herein, includes one or more electric motors, such as DC motors or AC motors. Examples of an electric motor include an AC brushless motor, a DC brushed motor, a DC brushless motor, a direct drive motor, a linear motor, a servo motor, a three phase motor, a single phase motor, a slip ring induction motor, a Squirrel cage induction motor, a cumulative compound motor, and a stepper motor.

The power system 407 is coupled to the driver system 409, and the driver system 409 is coupled to the motor system 411. The motor system 411 is coupled to one or more variable capacitors of the high frequency matching network 408. For example, an electric motor of the motor system 411 is coupled via a connection mechanism to a variable capacitor of the high frequency matching network 408 and another electric motor of the motor system 411 is coupled via another connection mechanism to another variable capacitor of the high frequency matching network 408. An illustration of a connection mechanism, as described herein, includes one or more rods and one or more gears, and the rods are coupled to each other via the one or more gears. In an embodiment, the terms connection mechanism and coupler are used interchangeably.

The system 400 further includes a power system 413, a driver system 415, and a motor system 417. The power system 413 is coupled to the driver system 415, and the driver system 415 is coupled to the motor system 417. The motor system 417 is coupled to one or more variable capacitors of the combiner and distributor 121. For example, an electric motor of the motor system 417 is coupled via a connection mechanism to a variable capacitor of the combiner and distributor 121 and another electric motor of the motor system 417 is coupled via another connection mechanism to another variable capacitor of the combiner and distributor 121.

The system 400 also includes a power system 419, a driver system 421, and a motor system 423. The power system 419 is coupled to the driver system 421, and the driver system 421 is coupled to the motor system 423. The motor system 423 is coupled to one or more variable capacitors of the low frequency matching network 406. For example, an electric motor of the motor system 423 is coupled via a connection mechanism to a variable capacitor of the low frequency matching network 406 and another electric motor of the motor system 423 is coupled via another connection mechanism to another variable capacitor of the low frequency matching network 406.

The low frequency generator 402 generates an RF signal 401A having a frequency, e.g., 2 MHz frequency or 400 kHz frequency, etc., and provides the RF signal 401A via the coax cable 410 to the input of the low frequency matching network 406. The one or more variable capacitors of the low frequency matching network 406 are controlled by the system controller 110 to match an impedance of a load, e.g., the coaxial cable 414, the combiner and distributor 121, the coaxial cables 416A through 416D, and the stations 1 through 4, etc., that is coupled to the output of the low frequency matching network 406 with that of a source, e.g., the coaxial cable 410 and the low frequency generator 402, etc., that is coupled to the input of the low frequency matching network 406 to generate a modified RF signal 403A upon receiving the RF signal 401A from the low frequency RF generator 402.

To provide an example illustrating control of a variable capacitor, a system controller, described herein, sends an instruction signal to a power system to provide an amount of power and to provide a directionality of flow of power. The power system is coupled to the system controller. Multiple power sources of the power system generate a power signal having the amount and the directionality and sends the power signal to a driver system that is coupled to the power system. The driver system generates a current signal upon receiving the power signal and sends the current signal to a motor of the motor system that is coupled to the driver system. A stator of the motor receives the current signal to generate a magnetic field having a magnetic flux, which has a direction. A rotor of the motor interacts with the magnetic flux and rotates in a stepwise manner in a clockwise or counterclockwise direction to rotate a connection mechanism that is coupled to the rotor. The rotation of the connection mechanism moves a rotor plate of the variable capacitor with respect to a stator plate of the variable capacitor. The rotor plate is coupled to the connection mechanism via a lead screw. The movement of the rotor plate maybe linear in a horizontal direction towards the stator plate or away from the stator plate or maybe a rotational movement of the rotor plate. In the rotational moment, there is no change in a distance between the rotor plate and the stator plate but an area of overlap between the stator and rotor plates changes, such as increases or decreases, to change a capacitance of the variable capacitor. In the linear movement, a distance between the stator and rotor plates changes, such as increases or decreases, to change the capacitance of the variable capacitor.

Similarly, the high frequency generator 404 generates an RF signal 401B having a frequency, e.g., 13 MHz frequency, 27 MHz frequency, 60 MHz frequency, etc., and provides the RF signal 401B via the coax cable 412 to the input of the high frequency matching network 408. The one or more variable capacitors of the high frequency matching network 408 are controlled by the system controller 110 to match an impedance of a load, e.g., the combiner and distributor 121, the coaxial cables 416A through 416D, and the stations 1 through 4, etc., that is coupled to the output of the high frequency matching network 408 with that of a source, e.g., the coaxial cable 412 and the high frequency generator 404, etc., that is coupled to the input of the high frequency matching network 408 to generate a modified RF signal 403B upon receiving the RF signal 401A from the high frequency RF generator 404.

The combiner and distributor 121 receives the modified RF signals 403A and 403B from the low frequency matching network 406 and the high frequency matching network 408, and combines the modified RF signals 403A and 403B to generate combined RF signals 405A, 405B, 405C, and 405D. During generation of the combined RF signals 405A, 405B, 405C, and 405D from the modified RF signals 403A and 403B, the one or more variable capacitors of the combiner and distributor 121 are controlled by the system controller 110. The combined RF signal 405A is sent via the OUT #1 to the station 1, the combined RF signal 405B is sent via the OUT #2 to the station 2, the combined RF signal 405C is sent via the OUT #3 to the station 3, and the combined RF signal 405D is sent via the OUT #4 to the station 4.

The parameter probe 408A measures a value of a parameter, e.g., complex voltage and current, DC bias voltage, complex impedance, complex power, etc., at the OUT #1 and provides the value to the system controller 110. Moreover, the parameter probe 408B measures a value of the parameter at the OUT #2 and provides the value to the system controller 110. The parameter probe 408C measures a value of the parameter at the OUT #3 and provides the value to the system controller 110. The parameter probe 408D measures a value of the parameter at the OUT #4 and provides the value to the system controller 110.

The processor of the system controller 110 determines one or more values of a variable, e.g., capacitance, etc., of corresponding one or more tuning circuits, such as one or more variable capacitors, of the combiner and distributor 121 based on the values of the parameter received from the parameter probes 408A through 408D. For example, the processor of the system controller 110 determines that for a value of the parameter associated with the station 1 to be within a pre-determined range, e.g., same as, etc., of a value of the parameter associated with the station 2, a value of the variable of one of the tuning circuits of the combiner and distributor 121 is V1 and a value of the variable of another one of the tuning circuits of the combiner and distributor 121 is V2. The processor of the system controller 110 controls the tuning circuits of the combiner and distributor 110 to achieve the values V1 and V2 of the variable to achieve the pre-determined range between the values of the parameter. As another example, a correspondence, e.g., a one-to-one matching, an association, a mapping, a row within a look-up table, etc., among values of the variable of all tuning circuits of the combiner and distributor 110 and values of the parameter at the outputs OUT #1 through OUT #4 is stored within the memory device that is coupled to the processor. Upon receiving a value of the parameter from the parameter probe 408A and a value of the parameter from the parameter probe 408B, the processor determines that the values are not within the pre-determined range from each other. The processor accesses the correspondence from the memory device to determine a value of the variable of one of the tuning circuits coupled to the OUT #1 and/or a value of the variable of one of the tuning circuits coupled to the OUT #2 so that the value of the parameter at the OUT #1 is within the pre-determined range from a value of the parameter of another one of the tuning circuits coupled to the OUT #2. The processor controls the value of the variable of the tuning circuit coupled to the OUT #1 and/or the value of the variable of the tuning circuit coupled to the OUT #2 so that the value of the parameter at the OUT #1 is within the pre-determined range from the value of the parameter at the OUT #2.

It should be noted that a number of the outputs of the combiner and distributor 121 match a number of the stations. For example, in case three stations are used to process the wafer 101, the combiner and distributor 121 has three outputs, where each output is coupled to a corresponding one of the stations.

In some embodiments, instead of the low frequency generator 402, a medium frequency generator is used. An example of the medium frequency generator includes an RF generator having an operating frequency of 1 MHz or 2 MHz. In these embodiments, the medium frequency generator generates an RF signal having the medium frequency. Moreover, instead of the low frequency matching network 406, a medium frequency matching network is used and the medium frequency matching network is coupled to the medium frequency generator.

In various embodiments, a tool controller is coupled to the system controller 110 to provide instructions to the system controller 110 to perform the functions described herein as being performed by the system controller 110.

In some embodiments, the system controller 110 includes any number of controllers for performing the functions described herein as being performed by the system controller 110 and the functions are distributed between the controllers. For example, the tool controller is a part of the system controller 110.

In various embodiments, the combiner and distributor 121, the high frequency matching network 408, and the low frequency matching network 406 are remotely located from the stations 1 through 4. For example, a length of the each of the coax cables 416A through 416D ranges from four feet to six feet. As another example, a length of the each of the coax cables 416A through 416D ranges from six feet to eight feet.

In some embodiments, each of the coax cables 416A through 416D is a part of the combiner and distributor 121. For example, each of the coax cables 416A through 416D is not a 50 ohm RF transmission line. To illustrate, each of the coax cables 416A through 416D does not encounter an impedance of 50 ohms at its input and output. Rather, RF power being transferred via each of the coax cables 416A through 416D undergoes a change in voltage and current along a length of the coax cable. To illustrate, each of the coax cables 416A through 416D offers a series of capacitances and a series of inductances to an RF signal received from the corresponding outputs OUT #1, OUT #2, OUT #3, and OUT #4 and passing through the coax cable.

Figure 5:
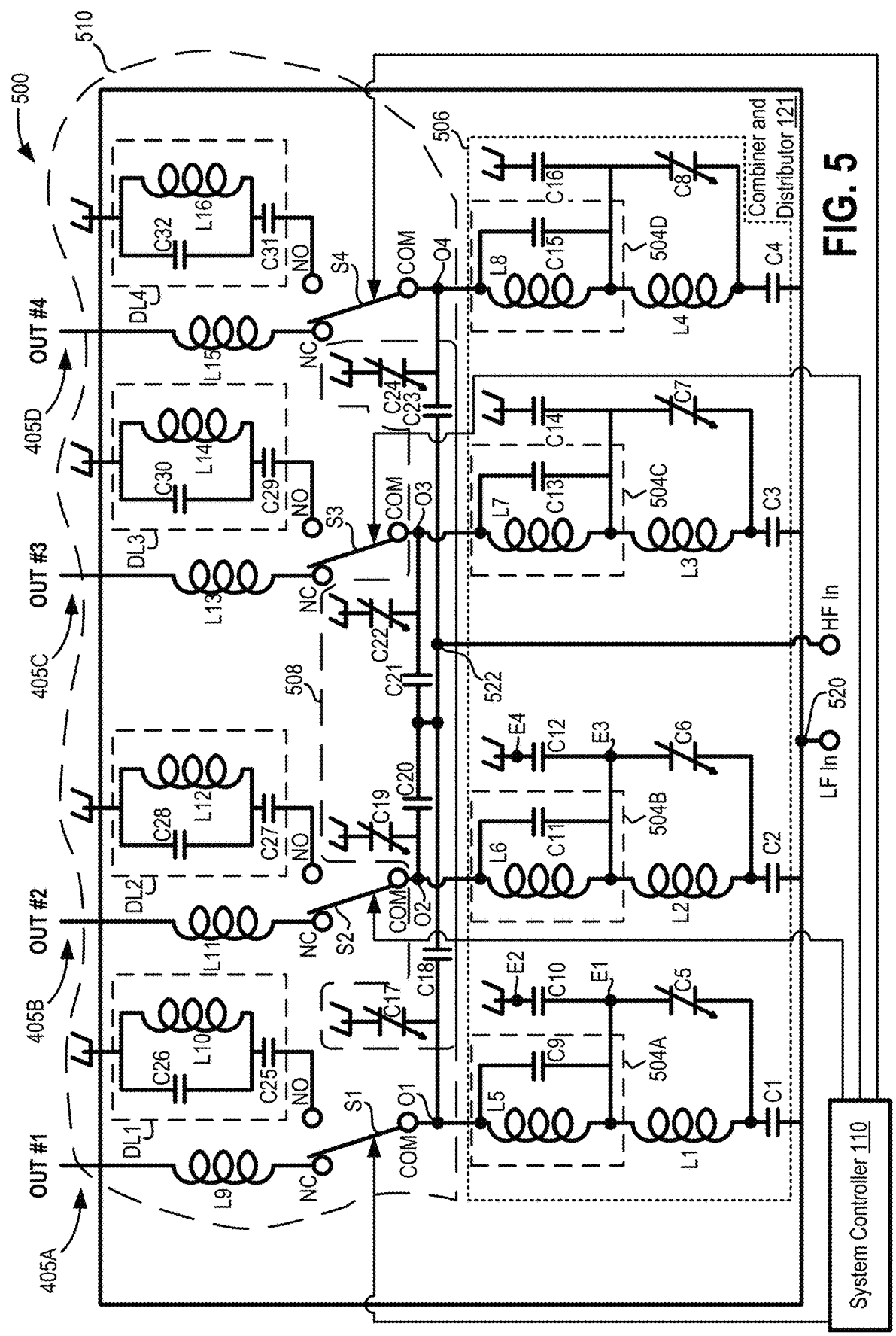
FIG. 5 is an embodiment of a system to illustrate a circuit diagram of an embodiment of the combiner and distributor.

FIG. 5 is an embodiment of a system 500 to illustrate a circuit diagram of an embodiment of the combiner and distributor 121. The system 500 includes the system controller 110 and further includes the combiner and distributor 121.

The combiner and distributor 121 has a low frequency circuit 506, a high frequency circuit 508, and an output circuit 510. The low frequency circuit 506 is coupled to the high frequency circuit 508, which is further coupled to the output circuit 510. The low frequency circuit 506 includes DC blocking capacitors C1, C2, C3, and C4. The low frequency circuit 506 further includes multiple tuning circuits C5, C6, C7, and C8, which are variable capacitors, and the low frequency circuit 506 further includes inductors L1, L2, L3, and L4. The low frequency circuit 506 includes a high frequency blocking circuit 504A, a high frequency blocking circuit 504B, and a high frequency blocking circuit 504C, a high frequency blocking circuit 504D. The high frequency blocking circuit 504A includes an inductor L5 coupled in parallel with a capacitor C9. For example, an end of the inductor L5 is connected to an output O1 and an opposite end of the inductor L5 is connected to an end E1. Moreover, in the example, an end of the capacitor C9 is connected to the output O1 and an opposite end of the capacitor C9 is connected to the end E1. Similarly, the high frequency blocking circuit 504B includes an inductor L6 coupled in parallel with a capacitor C11, the high frequency blocking circuit 504C includes an inductor L7 coupled in parallel with a capacitor C13, and the high frequency blocking circuit 504D includes an inductor L8 coupled in parallel with a capacitor C15. For example, an end of the inductor L6 is connected to an output O2 and an opposite end of the inductor L6 is connected to an end E3. Moreover, in the example, an end of the capacitor C11 is connected to the output O2 and an opposite end of the capacitor C11 is connected to the end E3. The low frequency circuit 506 further includes capacitors C10, C12, C14, and C16.

The high frequency circuit 508 has capacitors C18, C20, C21, and C23. The high frequency circuit 508 further includes tuning circuits C17, C19, C22, and C24, which are variable capacitors. In some embodiments, each of the variable capacitors C5, C6, C7, C8, C17, C19, C22, and C24 is a vacuum capacitor.

The output circuit 510 includes dummy loads DL1, DL2, DL3, and DL4, and further includes balancing inductors L9, L11, L13, and L15. The output circuit 510 includes switches S1, S2, S3, and S4. An example of a switch includes a transistor or a combination of one or more transistors.

The dummy load DL1 includes a capacitor C26 coupled in parallel to an inductor L10, and further includes a DC blocking capacitor C25. Similarly, the dummy load DL2 includes a capacitor C28 coupled in parallel to an inductor L12, and further includes a DC blocking capacitor C27. Also, the dummy load DL3 includes a capacitor C30 coupled in parallel to an inductor L14, and further includes a DC blocking capacitor C29. The dummy load DL4 includes a capacitor C32 coupled in parallel to an inductor L16, and further includes a DC blocking capacitor C31. Each of the DC blocking capacitors C25, C27, C29, and C30 blocks DC power from reaching the corresponding capacitors C26, C28, C29, and C32, and the corresponding inductors L10, L12, L14, and L16 of the dummy loads DL1 through DL4. To illustrate, the DC blocking capacitor C25 blocks the DC power from being transferred from the plasma of the station 1 via the OUT #1 to the capacitor C26 and the inductor L10. The DC power is received from the plasma generated within the corresponding stations 1 through 4. For example, the DC power blocked by the DC block capacitor C25 is generated by wafer DC bias created by plasma in the station 1 and the DC power blocked by the DC blocking capacitor C27 is generated by wafer DC bias created by plasma in the station 2.

The capacitors C1 through C4 are coupled via an input 520 of the low frequency circuit 506 to the low frequency matching network 406 (FIG. 4) to receive the modified RF signal 403A of the low frequency from the low frequency matching network 406 via the coaxial cable 414 (FIG. 4) and the input 520. The capacitors C1 through C4 block the DC power received from plasma generated within the stations 1 through 4 from reaching the low frequency RF generator 402 (FIG. 4) via the input 520, the coaxial cable 414, the low frequency matching network 406, and the coaxial cable 410 (FIG. 4). For example, the capacitor C1 blocks power generated by wafer DC bias created by plasma within the station 1 and the capacitor C2 blocks power generated by wafer DC bias created by plasma within the station 2.

Each of the inductors L1 through L4 acts as a capacitor at the high frequency. The high frequency blocking circuits 504A through 504D blocks the high frequency of the modified RF signal 403B of the high frequency received from the high frequency matching network 408 (FIG. 4) via an input 522 of the high frequency circuit 510 from reaching the low frequency RF generator 402 via the input 520, the coaxial cable 414, the low frequency matching network 406, and the coaxial cable 410 (FIG. 4). For example, the high frequency blocking circuit 504A blocks the high frequency of the modified RF signal 403B received via the input 522 from reaching via the inductor L1, the capacitor C1, the input 520, the coaxial cable 414, the low frequency matching network 406, and the coaxial cable 410 to the low frequency RF generator 402.

The capacitors C10, C12, C14, and C16 provide a path to ground for any residual high frequency power leaked from the corresponding high frequency blocking circuits 504A through 504D. For example, the capacitor C10 is coupled to a ground connection at one end E2 and to the high frequency blocking circuit 504A at the opposite end E1. As another example, the capacitor C12 is coupled to a ground connection at one end E4 and to the high frequency blocking circuit 504B at the opposite end E3. One or more capacitances of corresponding one or more of the variable capacitors C5 through C8 are changed so that the values of the parameter at two or more of the outputs OUT #1, OUT #2, OUT #3, and OUT #4 are within the pre-determined range from each other. Similarly, one or more capacitances of corresponding one or more of the variable capacitors C17, C19, C22, and C24 are changed so that the values of the parameter at two or more of the outputs OUT #1, OUT #2, OUT #3, and OUT #4 are within the pre-determined range from each other. In some embodiments, one or more of the capacitances of corresponding one or more of the variable capacitors C5, C6, C7, C8, C17, C19, C22, and C24 are changed so that the values of the parameter at two or more of the outputs OUT #1, OUT #2, OUT #3, and OUT #4 are within the pre-determined range from each other. The capacitors C18, C20, C21, and C23 filter out the low frequency of the modified RF signal 403A received from the low frequency matching network 406 via the coaxial cable 414 (FIG. 4) and the input 520. For example, the capacitor C18 filters out the low frequency of the modified RF signal 403A received from the low frequency matching network 406 via the coaxial cable 414, the input 520, the capacitor C1, the inductor L1, and the high frequency blocking circuit 504A.

Each of the switches S1 through S4 is open, e.g., normally open (NO), etc., by being coupled to a normally open terminal of the switch or closed, e.g., normally closed (NC), etc., by being coupled to a normally closed terminal of the switch. Each of the switches S1 through S4 is open or closed with respect to a common terminal (COM) of the switch. For example, when an off signal, e.g. an amount of current less than a pre-specified amount, etc., is sent from the processor to the switch S1, the switch S1 is in the open position, e.g., an off state, etc. Moreover, when an on signal, e.g. an amount of current greater than the pre-specified amount, etc., is sent from the processor to the switch S1, the switch is in the closed position, e.g., an on state, etc.

The switches S1 through S4 are coupled to the system controller 110 to be controlled by the system controller 110. The switches S1 through S4 are controlled to be in the open or close position upon receiving a control signal from the processor of the system controller 110. For example, the switch S1 closes to couple the output O1 of the low frequency circuit 506 and the high frequency circuit 508 to the station 1 via the inductor L9 and the OUT #1 of the output circuit 510 so that plasma is enabled, e.g., generated, maintained, etc., within the station 1. As another example, the switch S2 closes to couple the output O2 of the low frequency circuit 506 and the high frequency circuit 508 to the station 2 via the inductor L11 and the OUT #2 of the output circuit 510 so that plasma is enabled within the station 2. As yet another example, the switch S3 closes to couple an output O3 of the low frequency circuit 506 and the high frequency circuit 508 to the station 3 via the inductor L13 and the OUT #3 of the output circuit 510 so that plasma is enabled within the station 3. As another example, the switch S4 closes to couple an output O4 of the low frequency circuit 506 and the high frequency circuit 508 to the station 4 via the inductor L15 and the OUT #4 of the output circuit 510 so that plasma is enabled within the station 4. As another example, the switch S1 is open to couple the output O1 of the low frequency circuit 506 and the high frequency circuit 508 to the dummy load DL1 so that plasma is disabled, e.g., not generated, turned off, etc., within the station 1. As another example, the switch S2 is open to couple the output O2 of the low frequency circuit 506 and the high frequency circuit 508 to the dummy load DL2 so that plasma is disabled within the station 2. As yet another example, the switch S3 is open to couple the output O3 of the low frequency circuit 506 and the high frequency circuit 508 to the dummy load DL3 so that plasma is disabled within the station 3. As another example, the switch S4 is open to couple the output O4 of the low frequency circuit 506 and the high frequency circuit 508 to the dummy load DL4 so that plasma is disabled within the station 4.

By switching RF power of the modified RF signals 403A and 403B (FIG. 4) to one or more of the stations 1 through 4, power is selectively diverted to the one or more stations 1 through 4 to enable plasma in the one or more of the stations 1 through 4. For example, the switch S1 is controlled by the system controller 110 to be in the closed position so that RF power of the combined RF signal 405A at the output O1 is sent to the station 1 via the inductor L9, the OUT #1, and the coaxial cable 416A (FIG. 4) to enable plasma within the station 1. As another example, the switch S2 is controlled by the system controller 110 to be in the closed position so that RF power of the combined RF signal 405B at the output O2 is sent to the station 2 via the inductor L11, the OUT #2, and the coaxial cable 416B (FIG. 4) to enable plasma within the station 2. As yet another example, the switch S3 is controlled by the system controller 110 to be in the closed position so that RF power of the combined RF signal 405C at the output O3 is sent to the station 3 via the inductor L13, the OUT #3, and the coaxial cable 416C (FIG. 4) to enable plasma within the station 3. As another example, the switch S4 is controlled by the system controller 110 to be in the closed position so that RF power of the combined RF signal 405C at the output O4 is sent to the station 4 via the inductor L15, the OUT #4, and the coaxial cable 416D (FIG. 4) to enable plasma within the station 4.

On one hand, when the station 1 is to be used for plasma processing, e.g., ignite, enable, or control plasma, etc., RF power of the modified RF signals 403A and 403B is diverted from the dummy load DL1 to the station 1. For example, when the station 1 is to be used for processing the wafer 101, the switch S1 is controlled by the system controller 110 to close the switch S1 so that RF power of the combined RF signal 405A at the output O1 is diverted to the station 1 via the inductor L9 and the OUT #1. On the other hand, when one of the stations 1 through 4 is not to be used for plasma processing, RF power is diverted from the station to a dummy load corresponding to the station. For example, when the station 1 is not to be used for processing the wafer 101, the switch S1 is controlled by the system controller 110 to open the switch S1 so that RF power of the combined RF signal 405A at the output O1 is diverted to the dummy load DL1. There is no need to turn off, e.g., power off, remove power from, etc., one or both of the low frequency RF generator 402 and the high frequency RF generator 404 (FIG. 4) to remove RF power to the station 1.

The modified RF signal 403A (FIG. 4) that is received at the input 520 from the low frequency matching network 406 (FIG. 4) is processed by the inductors L1 through L4, the capacitors C5 through C8, the high frequency blocking circuits 504A through 504D, and the capacitors C10, C12, C14, and C16 to provide RF signals at the outputs O1 through O4. For example, a portion of the modified RF signal 403A that is received at the input 520 is processed by the capacitor C1, the inductor L1, the capacitor C5, the high frequency blocking circuit 504A, and the capacitor C10 to provide an RF signal of the low frequency at the output O1. As another example, a portion of the modified RF signal 403A that is received at the input 520 is processed by the capacitor C2, inductor L2, the capacitor C6, the high frequency blocking circuit 504B, and the capacitor C12 to provide an RF signal of the low frequency at the output O2. As yet another example, a portion of the modified RF signal 403A that is received at the input 520 is processed by the capacitor C3, inductor L3, the capacitor C7, the high frequency blocking circuit 504C, and the capacitor C14 to provide an RF signal of the low frequency at the output O3. As still another example, a portion of the modified RF signal 403A that is received at the input 520 is processed by the capacitor C4, inductor L4, the capacitor C8, the high frequency blocking circuit 504D, and the capacitor C16 to provide an RF signal of the low frequency at the output O4.

Similarly, the modified RF signal 403B (FIG. 4) that is received at the input 522 from the high frequency matching network 408 (FIG. 4) is processed by the capacitors C17 through C24 to provide RF signals at the outputs O1 through O4 within the combiner and distributor 121. For example, a portion of the modified RF signal 403B of the high frequency that is received at the input 522 is processed by the capacitors C17 and C18 to provide an RF signal of the high frequency at the output O1. As another example, a portion of the modified RF signal 403B of the high frequency that is received at the input 522 is processed by the capacitors C19 and C20 to provide an RF signal of the high frequency at the output O2. As yet another example, a portion of the modified RF signal 403B of the high frequency that is received at the input 522 is processed by the capacitors C21 and C22 to provide an RF signal of the high frequency at the output O3. As still another example, a portion of the modified RF signal 403B of the high frequency that is received at the input 522 is processed by the capacitors C23 and C24 to provide an RF signal of the high frequency at the output O4.

The RF signals received at the outputs O1 through O4 from the low frequency circuit 506 and the high frequency circuit 508 are combined at the outputs O1 through O4 to provide the combined RF signals 405A through 405D (FIG. 4) at the outputs O1 through O4. For example, the RF signal received at the output O1 from the low frequency circuit 506 is summed at the output O1 with the RF signal received at the output O1 from the high frequency circuit 508 to generate the combined RF signal 405A at the output O1. As another example, the RF signal received at the output O2 from the low frequency circuit 506 is summed at the output O2 with the RF signal received at the output O2 from the high frequency circuit 508 to generate the combined RF signal 405B at the output O2. As yet another example, the RF signal received at the output O3 from the low frequency circuit 506 is summed at the output O3 with the RF signal received at the output O3 from the high frequency circuit 508 to generate the combined RF signal 405C at the output O3. As another example, the RF signal received at the output O4 from the low frequency circuit 506 is summed at the output O4 with the RF signal received at the output O4 from the high frequency circuit 508 to generate the combined RF signal 405D at the output O4.

The combined RF signal 405A generated at the output O1 is sent from the output O1 via the switch S1 in the closed position, the balancing inductor L9, and the OUT #1 to the station 1 for plasma processing of the wafer 101 at the station 1 or is sent via the switch S1 in the open position to the dummy load DLL Similarly, the combined RF signal 405B generated at the output O2 is sent from the output O2 via the switch S2 in the closed position, the balancing inductor L11, and the OUT #2 to the station 2 for plasma processing of the wafer 101 at the station 2 or is sent via the switch S2 in the open position to the dummy load DL2. Moreover, the combined RF signal 405C generated at the output O3 is sent from the output O3 via the switch S3 in the closed position, the balancing inductor L13, and the OUT #3 to the station 3 for plasma processing of the wafer 101 at the station 3 or is sent via the switch S3 in the open position to the dummy load DL3. Also, the combined RF signal 405D generated at the output O4 is sent from the output O4 via the switch S4 in the closed position, the balancing inductor L15, and the OUT #4 to the station 4 for plasma processing of the wafer 101 at the station 4 or is sent via the switch S4 in the open position to the dummy load DL4.

In case one of the combined RF signals 405A through 405D is not to be provided to one of the stations 1 through 4, a corresponding one of the outputs O1 through O4 is coupled to a corresponding one of the dummy loads DL1 through DL4. For example, when one of the combined RF signals 405A through 405D is to not to be provided to the station 1, the processor of the system controller 110 sends a signal to the switch S1 to open the switch S1 to couple the output O1 to the dummy load DL1. The dummy load DL1 has the impedance within the pre-determined limit from the impedance of the station 1 so that the other stations 2 through 4 that receive the other combined RF signals 405B through 405D via the outputs OUT #2 through OUT #4 do not see a change in impedance at their corresponding inputs.

In various embodiments, the outputs O1 through O4 are parts of the output circuit 510.

In some embodiments, the dummy load DL1 has an impedance that is within a pre-determined limit, e.g., same as, etc., from an impedance of the station 1, the dummy load DL2 has an impedance that is within the pre-determined limit from an impedance of the station 2, the dummy load DL3 has an impedance that is within the pre-determined limit from an impedance of the station 3, and the dummy load DL4 has an impedance that is within the pre-determined limit from an impedance of the station 4.

Figure 6:
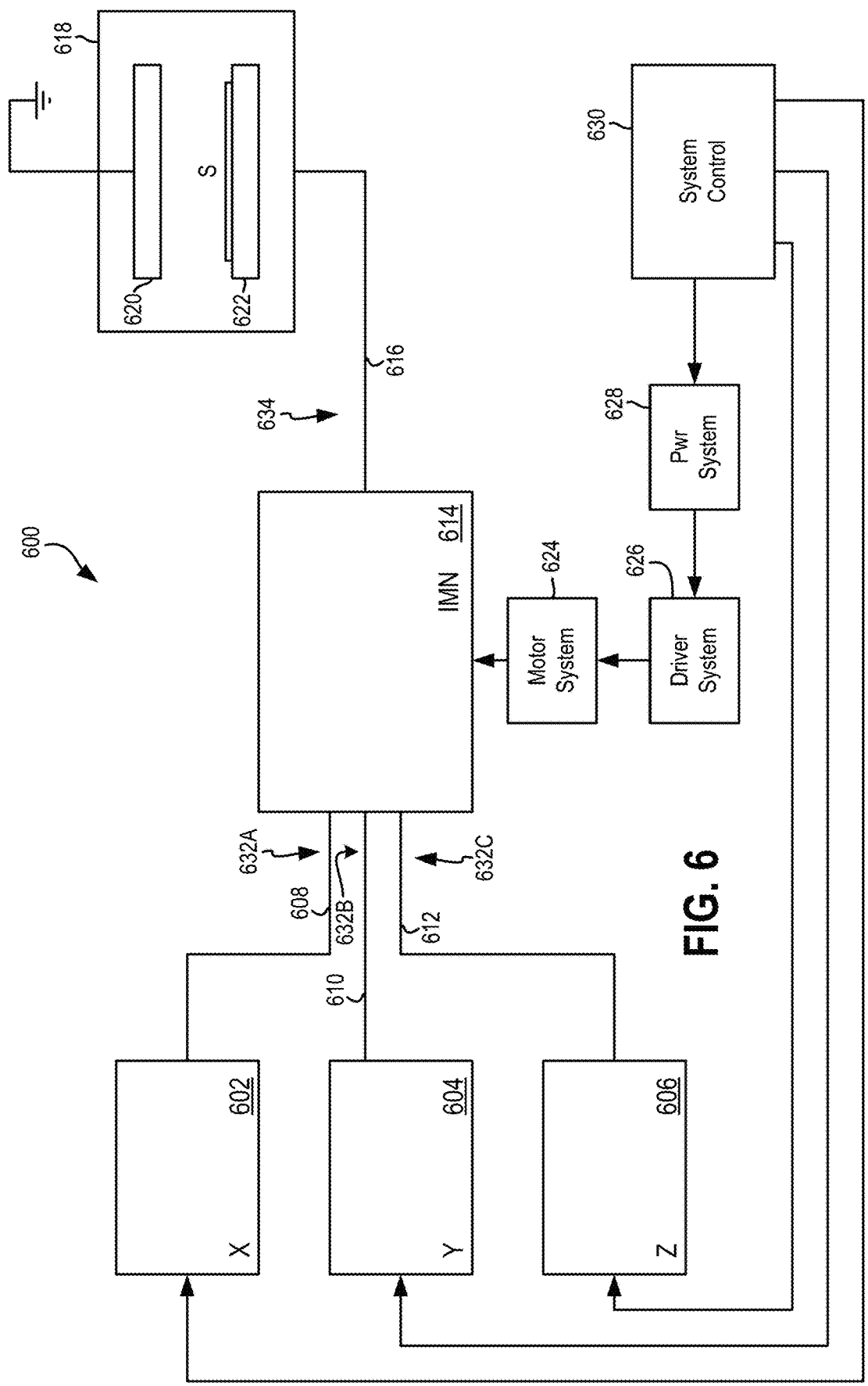
FIG. 6 is a diagram of an embodiment of a plasma tool to illustrate a dielectric etch system or a capacitively coupled plasma (CCP) system.

FIG. 6 is a diagram of an embodiment of a system 600, such as a plasma tool, to illustrate a dielectric etch system or a capacitively coupled plasma (CCP) system. The system 600 includes an X megahertz RF generator 602, a Y megahertz RF generator 604, and a Z megahertz RF generator 606. An example of the X megahertz RF generator 602 includes a 2 MHz RF generator, an example of the Y megahertz RF generator 604 includes a 13.56 MHz or a 27 MHz RF generator, and an example of the Z megahertz RF generator 606 includes a 60 MHz RF generator.

The system 600 further includes an impedance matching network 614 and a plasma chamber 618. An impedance matching network, described herein, includes a network of one or more capacitors and one or more inductors and/or one or more resistors. The terms impedance matching network, match network, impedance matching circuit, and matching network are used herein interchangeably. Examples of a capacitor, as used herein, include a fixed capacitor and a variable capacitor. The one or more capacitors are coupled to the one or more inductors and to the one or more resistors of the impedance matching network 614. For example, a branch circuit of the impedance matching network 614 is coupled to the X megahertz RF generator 602 via an RF cable 608, another branch circuit of the impedance matching network 614 is coupled to the Y megahertz RF generator 604 via another RF cable 610, and yet another branch circuit of the impedance matching network 614 is coupled to the Z megahertz RF generator 606 via yet another RF cable 612. The three branch circuits of the impedance matching network 614 are coupled to an RF transmission line 616 via an output of the impedance matching network 614.

The plasma chamber 618 includes an electrostatic chuck 622 having a top surface on which a substrate S is placed for processing. As an example, the substrate S is processed by depositing one or more materials on the substrate S, or by etching the substrate S, or by sputtering the substrate S, or by cleaning the substrate S. Across the electrostatic chuck 622, there is an upper electrode 622 form a gap between the upper electrode 620 and the electrostatic chuck 622 within the plasma chamber 618. The upper electrode 620 is coupled to a ground potential. The electrostatic chuck 622 has embedded in it a lower electrode, which is coupled to the RF transmission line 616. Each of the upper electrode 622 and the lower electrode are made from metal, such as aluminum or an alloy of aluminum.

The system 600 further includes a motor system 624, a driver system 626, a power system 628, and a system controller 630. The system controller 630 is coupled to the power system 628, which is coupled to the driver system 626. The driver system 626 is coupled to the motor system 624 and the motor system 624 is coupled via one or more connection mechanisms to corresponding one or more variable capacitors of the impedance matching network 614. For example an electric motor of the motor system 624 is coupled via a connection mechanism to a variable capacitor of the impedance matching network 614 and another electric motor of the motor system 624 is coupled via another connection mechanism to another variable capacitor of the impedance matching network 614

The X megahertz RF generator 602 generates an RF signal 632A and supplies the RF signal 632A via the RF cable 608 to the impedance matching network 614. As an example, a power and frequency of the RF signal 632A is provided by a processor of the system controller 630 to the X megahertz RF generator 602. Similarly, the Y megahertz RF generator 604 generates an RF signal 632B and supplies the RF signal 632B via the RF cable 610 to the impedance matching network 614, and a power and frequency of the RF signal 632B is provided by the processor of the system controller 630 to the Y megahertz RF generator 604. Also, the Z megahertz RF generator 606 generates an RF signal 632C and supplies the RF signal 632C via the RF cable 612 to the impedance matching network 614, and a power and frequency of the RF signal 632C is provided by the processor of the system controller 630 to the Z megahertz RF generator 606.

The one or more variable capacitors of the impedance matching network 614 are controlled by the system controller 630 via the power system 628, the driver system 626 and the motor system 624 to change corresponding one or more capacitances of the one or more variable capacitors. The impedance matching network 614 receives the RF signals 632A, 632B, and 632C, and matches an impedance of a load that is coupled to the output of the impedance matching network 614 with an impedance of a source that is coupled to multiple inputs of the impedance matching network 614 to output a modified RF signal 634. An example of the load that is coupled to the output of the impedance matching network 614 includes the RF transmission line 616 and the plasma chamber 618. An example of the source that is coupled to the inputs of the impedance matching network 614 includes the RF cables 608, 610, and 610, and the RF generators 602, 604, and 606.

The modified RF signal 634 is supplied via the RF transmission line 634 to the lower electrode of the electrostatic chuck 622. When one or more process gases are supplied to the gap between the electrostatic chuck 622 and the upper electrode 620 in addition to the modified RF signal 634, plasma is stricken or maintained within the plasma chamber 618 to process the substrate S. Examples of the one or more process gases include an oxygen containing gas and a fluorine containing gas.

In one embodiment, instead of the X megahertz RF generator 602, a kilohertz RF generator, such as a 400 kHz RF generator is used.

In an embodiment, instead of coupling the upper electrode 620 to the ground potential, the upper electrode 620 is coupled to the RF transmission line 616 and the electrostatic chuck 622 is coupled to the ground potential.

In one embodiment, instead of coupling the upper electrode 620 to the ground potential, the upper electrode 620 is coupled via another transmission line to another impedance matching network, which is coupled to one or more RF generators.

In an embodiment, instead of the three RF generators 602, 604, and 606, one or more RF generators are used.

Figure 7:
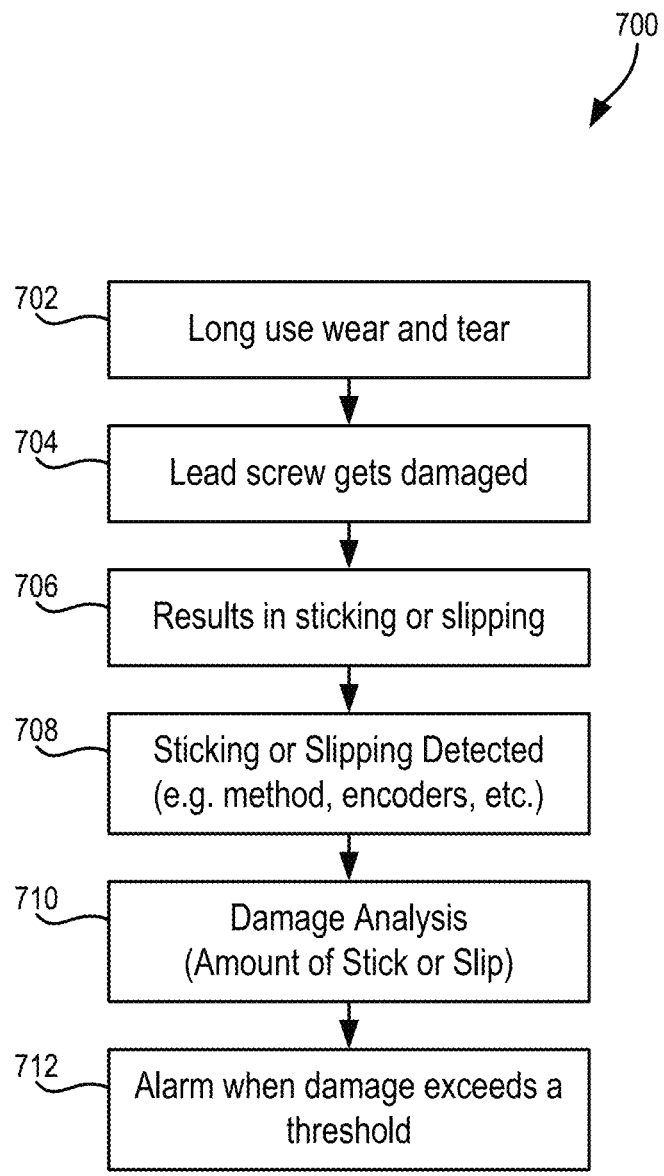
FIG. 7 is a flowchart of an embodiment of a method for determining a failure condition associated with a variable capacitor.

FIG. 7 is a flowchart of an embodiment of a method 700 for determining a failure condition, such as damage or non-function or malfunction, associated with a variable capacitor, described herein. The method 700 includes an operation 702 in which there is wear and tear of a connection mechanism or a lead screw or a driver system or a motor system that is coupled to the variable capacitor. An example of the wear and tear is illustrated in an operation 704 of the method 700 in which the lead screw gets damaged or is worn out. Another example of the wear and tear is damage to a lead screw or a connection mechanism or a motor system or a driver system or a combination thereof, and the damage creates a failure condition of a variable capacitor. The variable capacitor is coupled via the lead screw and the connection mechanism to the motor system, which is coupled to the driver system.

In an operation 706 of the method 700, any failure associated with the variable capacitor results in sticking or slipping. An example of slipping is when the variable capacitor does not move with movement of an electric motor that is coupled to the variable capacitor. To illustrate, the electric motor rotates but the variable capacitor does not undergo a corresponding linear or rotational motion. The variable capacitor is damaged or worn out. An example of sticking is when both the electric motor and the variable capacitor do not move when controlled by a system controller that is coupled to the electric motor via a power system and a driver. To illustrate, a processor of the system controller sends an instruction signal to the power system that is coupled to the processor. The power system generates an amount of power having a directionality and supplies the power to the driver that is coupled to the power system. The driver generates a current signal that is supplied to the electric motor. The electric motor generates a magnetic field but a rotor of the electric motor does not move. When the rotor does not move, the variable capacitor that is coupled to the rotor does not move. Both the electric motor and the variable capacitor may be damaged or worn out.

The method 700 further includes an operation 708 in which the sticking or slipping is detected. For example, the sticking or slipping is determined by applying the methods described below, which may include use of an encoder that is coupled to the electric motor coupled to the variable capacitor. In an operation 710 of the method 700, an amount of sticking or slipping, such as a number of times for which sticking or slipping occurs is determined. To illustrate, a count of the number of times for which the sticking or slipping occurs is maintained. In an operation 712 of the method 700, when the count of the number of times for which the sticking or slipping occurs exceeds a threshold m, an alarm is generated, where m is an integer greater than zero. For example, the processor of the system controller controls one or more speakers to output an audio alarm or controls a display device of the system controller to display a message indicating the alarm or a combination thereof. The alarm indicates a failure condition associated with the variable capacitor and that sooner or later the variable capacitor or the motor or the connection mechanism or a combination thereof is to be replaced.

Figure 8:
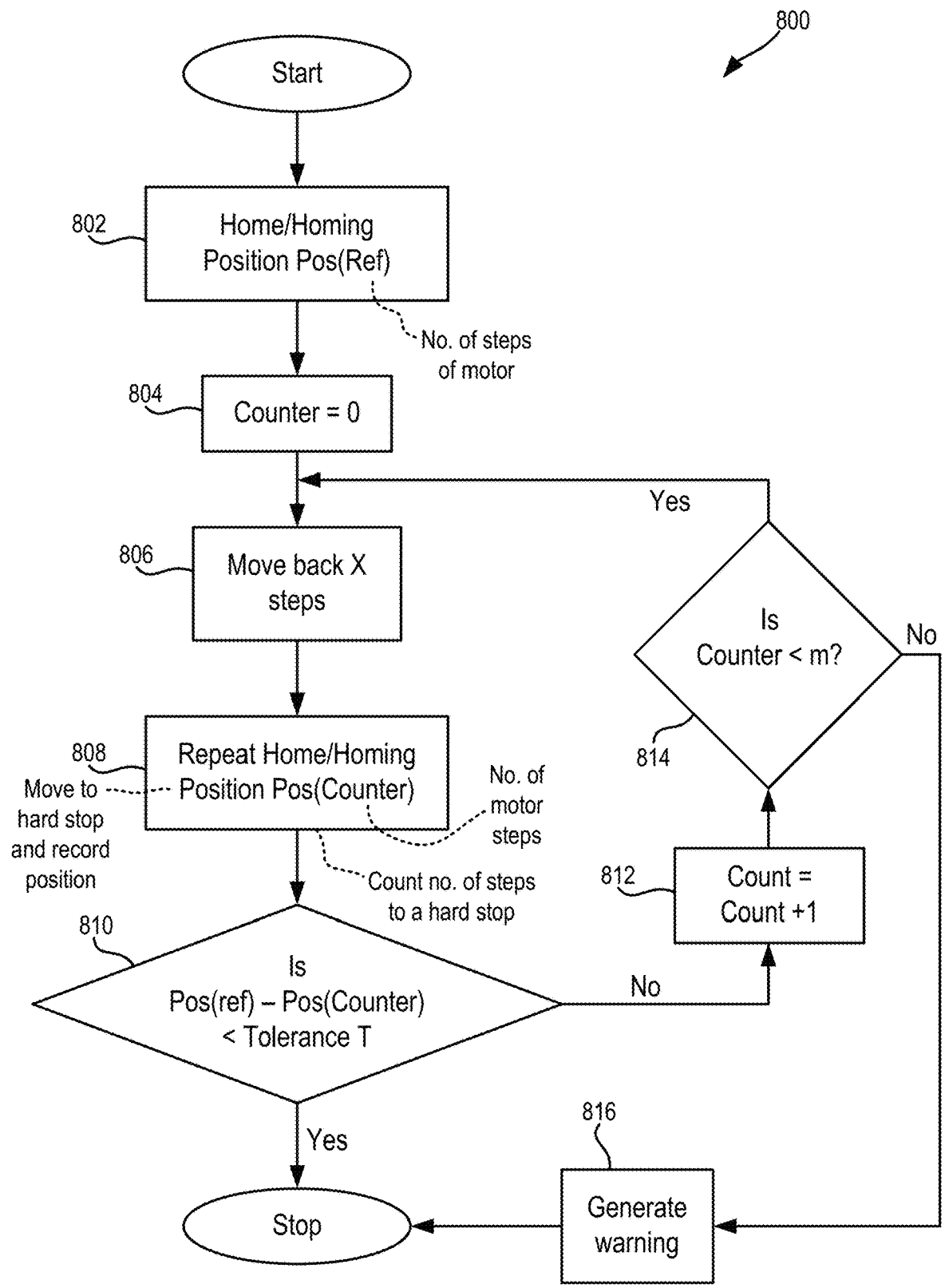
FIG. 8 is a diagram of an embodiment of a method to determine the failure condition associated with the variable capacitor.

FIG. 8 is a diagram of an embodiment of a method 800 to determine a failure condition associated with a variable capacitor, described herein. As an example, the method 800 is executed by a processor of a system controller, described herein. The method 800 includes an operation 802 in which the variable capacitor is controlled via an electric motor to move to a home position. In an embodiment, the terms home position and homing position or a reference position are used herein interchangeably.

In an embodiment, in the home position, the variable capacitor is moved to a stop position that corresponds to the lowest or highest value of a range of capacitance of the variable capacitor. For example, when the variable capacitor is functional, e.g., has not failed, and has the capacitance that ranges between 10 picoFarads (pF) and 100 pF, a first plate of the variable capacitor is moved in a linear direction away from a second plate or is rotated with respect to the second plate or a combination thereof to achieve the lowest capacitance of 10 pF. A perpendicular distance between the first plate and the second plate is maximum when the capacitance of the variable capacitor is 10 pF. The perpendicular distance is maximum among all perpendicular distances between the first and second plates for the remaining values of the range between 10 pF and 100 pF. The variable capacitor is designated to achieve the maximum capacitance of 100 pF or the minimum capacitance of 10 pF. The maximum perpendicular distance for which the capacitance of 10 pF is achieved is an example of the home position. All remaining capacitances that the variable capacitor can achieve lie between 10 pF and 100 picofarads. As another example, when the variable capacitor has the capacitance that ranges between the minimum capacitance of 10 pF and the maximum capacitance of 100 pF and is functional, the first plate of the variable capacitor is moved in a linear direction towards the second plate or is rotated with respect to the second plate or a combination thereof to achieve the capacitance of 100 pF. The perpendicular distance between the first plate and the second plate is minimum when the capacitance of the variable capacitor is 100 pF. The perpendicular distance is minimum among all perpendicular distances between the first and second plates for the remaining values of the range between 10 pF and 100 pF. The minimum perpendicular distance for which the capacitance of 100 pF is achieved is another example of the home position.

As another example, in the home position, the variable capacitor is moved to a stop position that corresponds to the lowest value of a range of capacitance of the variable capacitor. To further illustrate, when the variable capacitor is functional and has the capacitance that ranges between a lowest capacitance value of 10 pF and a highest capacitance value of 100 pF, the first plate of the variable capacitor is moved in a linear direction away from the second plate of the variable capacitor or is rotated with respect to the second plate or a combination thereof to achieve the capacitance of 10 pF. In this illustration, the home position is different from a hard stop position. In the hard stop position, the first and second plates of the variable capacitor cannot move any closer to each other. In this illustration, the hard stop position is a few steps apart from the home position. As another example, in the home position, the variable capacitor is moved to a stop position that corresponds to the highest value of a range of capacitance of the variable capacitor. To further illustrate, when the variable capacitor is functional and has the capacitance that ranges between a lowest capacitance value of 10 pF and a highest capacitance value of 100 pF, the first plate of the variable capacitor is moved in a linear direction towards the second plate of the variable capacitor or is rotated with respect to the second plate or a combination thereof to achieve the capacitance of 100 pF. In this illustration, the home position is different from a hard stop position. In the hard stop position, the first and second plates of the variable capacitor cannot move any further away from each other. In this illustration, the hard stop position is a few steps apart from the home position.

As yet another example, when the variable capacitor is associated with a failure condition, e.g., has failed, is damaged, etc., and has the capacitance that ranges between 10 pF and 100 pF, the first plate of the variable capacitor is moved in a linear direction away from the second plate or is rotated with respect to the second plate or a combination thereof to achieve the capacitance of 10 pF, and cannot be further moved in the linear direction or cannot be rotated to achieve a capacitance that is lower than 15 pF, which is greater than 10 pF. The maximum achievable perpendicular distance for which the capacitance of 15 pF is achieved is yet another example of the home position, such as a hard stop position. As another example, when the variable capacitor is associated with a failure condition and has the capacitance that ranges between the minimum capacitance of 10 pF and the maximum capacitance of 100 pF, the first plate of the variable capacitor is moved in a linear direction towards the second plate or is rotated with respect to the second plate or a combination thereof to achieve the capacitance of 100 pF, and cannot be further moved in the linear direction or cannot be rotated to achieve a capacitance that is greater than 80 pF, which is less than 100 pF. The minimum achievable perpendicular distance for which the capacitance of 80 pF is achieved is yet another example of the home position, such as a hard stop position.

In one embodiment, in the home position, such as a hard stop position, or in a hard stop position, the motor that is coupled to the variable capacitor is moved to a hard stop beyond which the motor cannot operate. Due to a failure of the motor, such as a motor burnout or a motor wear out or an overheated motor, the variable capacitor is at the home position or at the hard stop position. For example, upon receiving a current signal from a driver system, a rotor of the motor rotates by a number of steps and cannot rotate beyond a number of steps with respect to a stator of the motor. The motor, which cannot rotate, cannot move the variable capacitor and the variable capacitor is in the home position or at the hard stop position.

In the operation 802, the variable capacitor is controlled by the processor of the system controller via the electric motor to achieve the home position. When the home position is achieved in the operation 802, the processor records or stores a number of steps, such as Pos(Ref), taken by the electric motor to control the variable capacitor to achieve the home position. As an example, each revolution of a stepper electric motor is divided into a discrete number of steps, such as 200 steps, and the processor sends an instruction signal to a power system to generate a pulse having an amount of power and a first pulse direction. The power system is coupled to the processor. The pulse having the first pulse direction is supplied to a driver system that is coupled to the power system to generate a first pulse of an electric current signal. When the stepper electric motor receives the first pulse of the electric current signal, the stepper electric motor steps or rotates in a first motor direction by one step. In this manner, the stepper electric motor steps or rotates in a direction by one step upon receiving a pulse of the electric current signal. The number of steps Pos(Ref) is stored or recorded in a memory device of the system controller. The memory device of the system controller is coupled to the processor of the system controller.

In an operation 804 of the method 800, the processor of the system controller initiates a counter to have a count of zero. For example, the processor stores the count within the memory device. As another example, the processor is coupled to a counter, which includes multiple registers, and sends a signal to the counter to maintain or update the count.

The method 800 includes an operation 806 in which the electric motor is controlled by the processor of the system controller to move back or reverse step X steps, where X is the same number Pos(Ref) as that recorded during the operation 802. Continuing with the preceding example, the processor sends an instruction signal to the power system to generate a pulse having an amount of power and a second pulse direction. The second pulse direction is opposite to the first pulse direction. To illustrate, when the first pulse direction is from a first power supply of the power system to a second power supply of the power system, the second pulse direction is from the second power supply to the first power supply. An example of the power supply includes a battery or a DC power supply. The pulse having the second pulse direction is supplied to the driver system, which generates a second pulse of the electric current signal. When the stepper motor receives the second pulse, the stepper electric motor steps or rotates in a second motor direction by one step. The second motor direction is opposite to the first motor direction. To illustrate, when the first motor direction of rotation of a rotor of the stepper electric motor is clockwise, the second motor of rotation of the rotor is counterclockwise and when the first motor direction of rotation is counterclockwise, the second motor of rotation of the rotor is clockwise.

In an operation 808 of the method 800, the processor controls the electric motor to achieve the home position and records a number of steps, such as Pos(Counter) taken to achieve the home position. For example, the processor controls the electric motor to further control the variable capacitor to reach a hard stop. The processor or the counter counts the number of steps Pos(Counter) taken by the electric motor to allow the variable capacitor to reach the hard stop and stores the count in the memory device. The processor stores or records the value Pos(Counter) in the memory device.

The method 800 includes an operation 810 in which the processor determines whether a difference between the values Pos(Ref) and Pos(Counter) is less than a tolerance T, which is a preset range, and stored in the memory device. An example of the tolerance T is a number of steps when an electric motor, described herein, is a stepper motor. The number of steps may be 1 or 2 steps or another predetermined number. The number of steps may be an integer or a positive real number that includes a fraction of an integer. The stepper motor that is damaged may be stuck between two steps to achieve the fractional step. To illustrate, when Pos(Ref) is 10 steps and Pos(Counter) is 7 steps and the tolerance T is 2 steps, the difference between the values Pos(Ref) and Pos(Counter) is three, which is greater than the tolerance T of two steps. As another illustration, when Pos(Ref) is 10 steps and Pos(Counter) is 14 steps and the tolerance T is 2 steps, the difference between the values Pos(Ref) and Pos(Counter) is four, which is greater than the tolerance T of two steps. Another example of the tolerance T is a rotational step, which is a number of rotations, such as turns, of an electric motor. A rotation may be complete or partial. The complete rotation is expressed in terms of an integer or 180 degrees and the partial rotation is expressed in terms of a fraction of an integer or less than 180 degrees. A rotation may be expressed in terms of degree or angle. To illustrate, when Pos(Ref) is 10 rotations in a clockwise direction and Pos(Counter) is 7 rotations in the clockwise direction and the tolerance T is 2 rotations in the clockwise direction, the difference between the values Pos(Ref) and Pos(Counter) is three rotations in the clockwise direction, which is greater than the tolerance T of two rotations. Yet another example of the tolerance T is a linear step, which includes an amount of movement of a connection mechanism that is coupled to an electric motor in a linear direction, such as a left direction or a right direction or a forward direction of a backward direction. The amount of movement is measured by a distance that is covered by the connection mechanism in the linear direction.

Upon determining that the difference is not less than, such as equal to or greater than, the tolerance T, the processor increments the count by one in an operation 812 of the method 800. The count was initiated to zero in the operation 804. Upon incrementing the count, the processor determines in an operation 814 of the method 800 whether the count is less than, such as equal to or greater than, a predetermined value or the threshold m, which is stored in the memory device of the system controller. An example of the threshold m includes a value that ranges between 4 and 7. Another example of the threshold m includes a value that ranges between 3 and 8. Yet another example of the threshold m includes a value that ranges between 2 and 9. Another example of the threshold m is one or two or three or four or five or six or seven of eight.

In response to determining that the count is less than the threshold m, the processor of the system controller repeats the operations 806, 808, 810, 812, and 814. The processor of the system controller continues to repeat the operations 806, 808, 810, 812, and 814 until the count is not less than the threshold m. Upon determining that the count is not less than the threshold m, the processor of the system controller executes an operation 816 of the method 800. For example, the processor of the system controller controls the display device of the system controller to generate a warning, such as an image indicating a failure condition associated with the variable capacitor. As another example, the processor controls one or more speakers of the system controller that are coupled to the processor to output a sound indicating the failure condition associated with the variable capacitor. As yet another example, both the display device and the one or more speakers are controlled to output the image and the sound. The method 800 ends after generating the warning in the operation 816. On the other hand upon determining that the difference between the values Pos(Ref) and Pos(Counter) is not less than the tolerance T, the method 800 ends.

In one embodiment, the method 800 described with reference to FIG. 8 is performed before processing of the substrate S within any of the stations 1 through 4 (FIG. 4) or within the plasma chamber 618 (FIG. 6). For example, each time the high frequency matching network 408 or the low frequency matching network 406 or the combiner and distributor 121 (FIG. 4) or the impedance matching network 614 (FIG. 6) is turned on or powered on, the operations 802, 804, 806, 808, 810, 812, 814, and 816 are performed to determine whether the failure condition is achieved and to indicate the failure condition.

FIG. 9A is a diagram of an embodiment of a system 900 to illustrate a control of a motor 904 to further control a variable capacitor 902 to achieve a home position HP1. The system 900 includes a system controller 918, a power supply 908, a driver 906, the motor 904, and the variable capacitor 902. The system controller 918 is an example of the system controller 110 (FIGS. 1, 4, and 5) or an example of the system controller 630 (FIG. 6). The power supply 908 is an example of a power supply of the power system 407 or 413 or 419 (FIG. 4) or 628 (FIG. 6). The driver 906 which includes one or more transistors that are coupled to each other, is an example of a driver of the driver system 409 or 415 or 421 (FIG. 4) or 626 (FIG. 6). The motor 904 is an example of an electric motor of the motor system 411 or 417 or 423 (FIG. 4) or 624 (FIG. 6). Also, the variable capacitor 902 is an example of a variable capacitor of the high frequency matching network 408 or the low frequency matching network 406 or the combiner and distributor 121 (FIG. 4) or the impedance matching network 614 (FIG. 6). To illustrate, the variable capacitor 902 is the capacitor C5 or C6 or C7 or C8 or C17 or C19 or C22 or C24 (FIG. 5).

The system controller 918 includes a processor 914 and a memory device 916. The processor 914 is coupled to the memory device 916. The processor 916 is also coupled to the power supply 908, which is coupled to the driver 906. The driver 906 is coupled to the motor 904, which is coupled via a connection mechanism 914 and a lead screw 910 to a plate 912B of the variable capacitor 902. The plate 912B is an example of a rotor plate or a movable plate and a plate 912A of the variable capacitor 902 is an example of a stator plate.

The processor 914 sends an instruction signal 920 to the power supply 908 to generate an amount of power and a direction, such as positive, of a pulse of a power signal 922 having the amount of power. As an example, the power supply 908 is a bi-directional power supply. To illustrate, the power supply 908 includes a first battery and a second battery. A positive terminal of the first battery that is coupled to a negative terminal of the second battery and a positive terminal of the second battery is coupled to a negative terminal of the first battery. When the positive terminal of the first battery supplies power to the negative terminal of the second battery, the direction of power is in the positive direction and when the positive terminal of the second battery supplies power to the negative terminal of the first battery, the direction of power is in a negative direction.

Upon receiving the instruction signal 920, the power supply 908 generates the pulse of the power signal 922 having the direction, such as the positive direction, and the amount and sends the power signal 922 to the driver 906. Upon receiving the pulse of the power signal 920, the driver 906 generates a current signal 924 and provides the current signal 924 to the motor 904. A rotor of the motor 904 rotates in a first motor direction, such as clockwise, by a step and the rotation is used to move or rotate the lead screw 910 via the connection mechanism 914 to change a perpendicular distance between the plates 912A and 912B. In such a manner, each time the processor 914 sends the instruction signal 920 to the power supply 908, the motor 904 rotates in the first motor direction by one step until the variable capacitor 902 achieves the home position HP1, such as a hard stop position or a stop position different from the hard stop position. To illustrate, the home position HP1 is the stop position corresponding to a capacitance of 10 pF of the variable capacitor 902 having a capacitance that ranges from 10 pF to 100 pF.

The processor 914 records, such as stores, a number of steps STP1 that are taken by the motor 904 to achieve the home position HP1. For example, the processor 914 records the number of times for which the instruction signal 920 is sent to the power supply 908. For each time the instruction signal 920 is sent to the power supply 908, a pulse of the power signal 922 is generated and the motor 904 rotates in the first motor direction by one step. The number of steps STP1 is stored by the processor 914 in the memory device 916.

Examples of a number of steps of an electric motor include a number of steps within a rotation of the electric motor, a number of rotations of the electric motor, and an amount of linear movement of a connection movement that is coupled to the electric motor. For example, when a stepper motor is used, the stepper motor takes multiple steps to complete one rotation. As another example, an electric motor rotates for a number of turns, which amount to one step. The number of turns taken includes one or more turns. To illustrate, the number of turns include a number of complete turns or a number of complete turns and a partial turn. As yet another example, a connection mechanism moves in a forward linear direction or a backward linear direction by a number of steps. Each time the connection mechanism moves by one step to cover an amount of distance in the forward or backward linear direction.

FIG. 9B is a diagram of an embodiment of the system 900 to illustrate that the motor 904 goes back STP1 steps or operates in a reverse manner to go back STP1 steps after the variable capacitor 902 achieves the home position HP1. The achievement of the home position HP1 is illustrated with reference to FIG. 9A. With reference to FIG. 9B, the processor 914 sends an instruction signal 926 to the power supply 908 to generate an amount of power and a direction, such as negative, of a pulse of a power signal 928 having the amount of power. The instruction signal 926 is for the motor 904 to step back STP1 steps.

Upon receiving the instruction signal 926, the power supply 908 generates the pulse of the power signal 928 having the direction and the amount and sends the power signal 930 to the driver 906. Upon receiving the pulse of the power signal 928, the driver 906 generates a current signal 930 and provides the current signal 930 to the motor 904. The rotor of the motor 904 rotates in a second motor direction, such as counterclockwise, by a step and the rotation is used to move or rotate the lead screw 910 via the connection mechanism 914 to change a perpendicular distance between the plates 912A and 912B. In such a manner, each time the processor 914 sends the instruction signal 926 to the power supply 908, the motor 904 rotates in the second motor direction by one step to go back STP1 steps.

It should be noted that a perpendicular distance P2 between the plates 912A and 912B is greater than that illustrated in FIG. 9A. For example, the perpendicular distance P2 is greater than the home position HP1 between the plates 912A and 912B illustrated in FIG. 9A. An example of the home position HP1 is a perpendicular distance between the plates 912A and 912B.

It should further be noted that the plates 912A and 912B move in a first linear direction in response to the instruction signal 926 and move in a second linear direction in response to the instruction signal 920 (FIG. 9A). The second linear direction is opposite to the first linear direction. For example, the movement in the first linear direction moves the plates 912A and 912B closer to each other and the movement in the second linear direction moves the plates 912A and 912B away from each other.

FIG. 9C is a diagram of an embodiment of the system 900 to illustrate that the motor 904 is controlled to control the variable capacitor 902 to be at the home position HP1 after the motor 924 is instructed to step back STP1 steps. The stepping back by STP1 steps is illustrated with reference to FIG. 9B. With reference to FIG. 9C, the processor 914 sends an instruction signal 932 to the power supply 908 to generate an amount of power and a direction, such as positive, of a pulse of a power signal 934 having the amount of power. The instruction 932 is to instruct the motor 904 to achieve the home position HP1.

Upon receiving the instruction signal 932, the power supply 908 generates the pulse of the power signal 934 having the direction and the amount and sends the power signal 934 to the driver 906. Upon receiving the pulse of the power signal 934, the driver 906 generates a current signal 936 and provides the current signal 936 to the motor 904. The rotor of the motor 904 rotates in the first motor direction, such as clockwise, by a step and the rotation is used to move or rotate the lead screw 910 via the connection mechanism 914 to change a perpendicular distance between the plates 912A and 912B. In such a manner, each time the processor 914 sends the instruction signal 932 to the power supply 908, the motor 904 rotates in the first motor direction by one step to allow the variable capacitor 902 to achieve the home position HP1. The motor 904 rotates by a number of steps STP2 in this manner.

The processor 914 records the number of steps STP2 that are taken by the motor 904 to facilitate the variable capacitor 902 to achieve the home position HP1. For example, the processor 914 records the number of times for which the instruction signal 932 is sent to the power supply 908. For each time the instruction signal 932 is sent to the power supply 908, a pulse of the power signal 934 is generated and the motor 904 rotates in the first motor direction by step. The number of steps STP2 is stored by the processor 914 in the memory device 916.

The processor 914 compares the number of steps STP2 to facilitate achieving the home position HP1 with the number of steps STP1 to achieve the home position HP1, as illustrated with reference to FIG. 9A, to determine whether the number S2 is within the tolerance T of the number STP1. For example, the processor 914 determines whether the number STP2 matches the number STP1. As another example, the processor 914 determines whether a difference between the numbers STP2 and STP1 or STP1 and STP2 is less than the tolerance T.

Upon determining that the number STP1 is within the tolerance T or not outside the tolerance T from the number STP1, the processor 914 determines that the failure condition associated with the variable capacitor 902 is not achieved and there is no need to replace the variable capacitor 902. For example, the processor 914 determines the difference between the numbers STP2 and STP1 or STP1 and STP2 is less than the tolerance T to determine that the failure condition does not exist.

It should further be noted that the plates 912A and 912B move in the first linear direction in response to the instruction signal 932 and the first linear direction is opposite to the second linear direction. The plates 912A and 912B move in the second linear direction in response to the instruction signal 926 (FIG. 9B).

FIG. 9D is a diagram of an embodiment of the system 900 to illustrate that the motor 904 is controlled to control the variable capacitor 902 to be at the home position HP1 after the motor 924 steps back STP1 steps. The operation of stepping back STP1 steps is illustrated with reference to FIG. 9B. The processor 914 sends an instruction signal 938 to the power supply 908 to generate an amount of power and a direction, such as positive, of a pulse of a power signal 940 having the amount of power. The instruction signal 938 is provided to the motor 904 to facilitate the variable capacitor 902 to achieve the home position HP1.

Upon receiving the instruction signal 938, the power supply 908 generates the pulse of the power signal 940 having the direction and the amount and sends the power signal 940 to the driver 906. Upon receiving the pulse of the power signal 940, the driver 906 generates a current signal 942 and provides the current signal 942 to the motor 904. The rotor of the motor 904 rotates in the first motor direction, such as clockwise, by a step and the rotation is used to move or rotate the lead screw 910 via the connection mechanism 914 to change a perpendicular distance between the plates 912A and 912B. In such a manner, each time the processor 914 sends the instruction signal 938 to the power supply 908, the motor 904 rotates in the first motor direction by one step to allow the variable capacitor 902 to achieve the home position HP1. However, instead of achieving the home position HP1, another position P3 is achieved by the variable capacitor 902 because of the failure condition associated with the variable capacitor 902. For example, a perpendicular distance between the plates 912A and 912B is P3.

The processor 914 records a number of steps STP3 that are taken by the motor 904 to facilitate the variable capacitor 902 to achieve the position P3. For example, the processor 914 records the number of times for which the instruction signal 938 is sent to the power supply 908. Each time the instruction signal 938 is sent to the power supply 908, a pulse of the power signal 940 is generated and the motor 904 rotates in the first motor direction by one step. The number of steps STP3 is stored by the processor 914 in the memory device 916.

A hard stop position is achieved the position P3. For example, the plates 912A and 912B cannot be moved any closer to each other when they are at the position P3, which is an example of a perpendicular distance between the plates 912A and 912B.

The processor 914 compares the number of steps STP3 for which the position P3 is achieved instead of achieving the home position HP1 with the number of steps STP1 to achieve the home position HP1, as illustrated with reference to FIG. 9A, to determine whether the number STP3 is within the tolerance T of the number STP1. For example, the processor 914 determines whether the number STP3 matches the number STP1. Upon determining that the number STP3 is outside the tolerance T or not less than the tolerance T from the number STP1, the processor 914 updates or increments a count from zero to 1. For example, the processor 914 determines the difference between the numbers STP3 and STP1 or STP1 and STP3 is not less than the tolerance T to determine to increment the count by one. The count is stored in the memory device 916 by the processor 914. As another example, the processor 914 is coupled to a counter and updates a count of the counter from zero to one.

It should further be noted that the plates 912A and 912B move in the first linear direction in response to the instruction signal 938 and the first linear direction is opposite to the second linear direction. The plates 912A and 912B move in the second linear direction in response to the instruction signal 926 (FIG. 9B).

FIG. 9E is a diagram of an embodiment of the system 900 to illustrate that the motor 904 goes back STP1 steps or operates reversely to go back STP1 steps after the variable capacitor 902 achieves the position P3 at which the hard stop is achieved. The processor 914 sends an instruction signal 944 to the power supply 908 to generate an amount of power and a direction, such as negative, of a pulse of a power signal 946 having the amount of power.

Upon receiving the instruction signal 944, the power supply 908 generates the pulse of the power signal 946 having the direction and the amount and sends the power signal 946 to the driver 906. Upon receiving the pulse of the power signal 946, the driver 906 generates a current signal 948 and provides the current signal 948 to the motor 904. The rotor of the motor 904 rotates in the second motor direction, such as counterclockwise, by a step and the rotation is used to move or rotate the lead screw 910 via the connection mechanism 914 to change a perpendicular distance between the plates 912A and 912B. In such a manner, each time the processor 914 sends the instruction signal 944 to the power supply 908, the motor 904 rotates in the second motor direction by one step to go back STP1 steps. When the motor 904 goes back STP1 steps, the variable capacitor 902 has a position P4. An example of P4 is a perpendicular distance between the plates 912A and 912B.

It should further be noted that the plates 912A and 912B move in the second linear direction in response to the instruction signal 944 and the second linear direction is opposite to the first linear direction. The plates 912A and 912B move in the first linear direction in response to the instruction signal 938 (FIG. 9D).

Figure 9F:
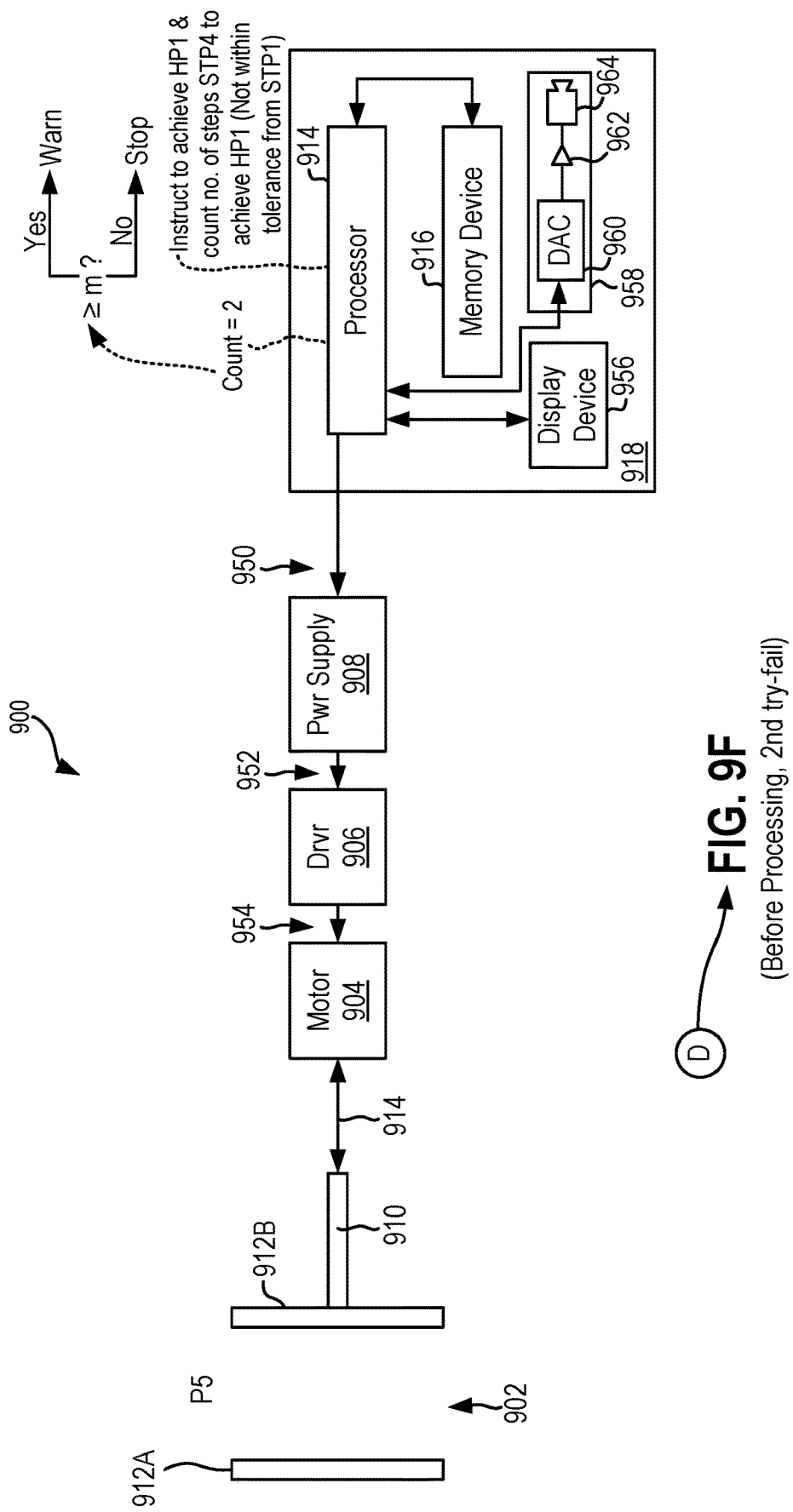
FIG. 9F is a diagram of an embodiment of the system of FIG. 9A to illustrate that the motor is controlled to control the variable capacitor to be at the home position HP1 after the motor steps back the number of steps, and a number of the steps in achieving the home position are recorded.

FIG. 9F is a diagram of an embodiment of the system 900 to illustrate that the motor 904 is controlled to control the variable capacitor 902 to be at the home position HP1 after the motor 924 steps back STP1 steps. The operation of stepping back by STP1 steps by the motor 904 is illustrated with reference to FIG. 9E.

The system controller 918 includes a display device 956, and an audio device 958. The audio device 958 includes a digital to analog converter (DAC) 960, an amplifier 962, and one or more speakers 964. Examples of the display device include a plasma display device, a light emitting diode display device, and a liquid crystal display device. The audio device 958 and the display device 956 are coupled to the processor 914. The digital to analog converter 960 is coupled to the amplifier 962, which is coupled to the one or more speakers 964.

The processor 914 sends an instruction signal 950 to the power supply 908 to generate an amount of power and a direction, such as positive, of a pulse of a power signal 952 having the amount of power. Upon receiving the instruction signal 950, the power supply 908 generates the pulse of the power signal 952 having the direction and the amount and sends the power signal 952 to the driver 906. Upon receiving the pulse of the power signal 952, the driver 906 generates a current signal 954 and provides the current signal 954 to the motor 904. The rotor of the motor 904 rotates in the first motor direction, such as clockwise, by a step and the rotation is used to move or rotate the lead screw 910 via the connection mechanism 914 to change a perpendicular distance between the plates 912A and 912B. In such a manner, each time the processor 914 sends the instruction signal 950 to the power supply 908, the motor 904 rotates in the first motor direction by one step to allow the variable capacitor 902 to achieve the home position HP1. However, instead of achieving the home position HP1, another position P5 is achieved by the variable capacitor 902 because of the failure condition associated with the variable capacitor 902. For example, a perpendicular distance between the plates 912A and 912B is P5.

The processor 914 records a number of steps STP4 that are taken by the motor 904 to facilitate achieving the position P5. For example, the processor 914 records the number of times for which the instruction signal 950 is sent to the power supply 908. Each time the instruction signal 950 is sent to the power supply 908, a pulse of the power signal 952 is generated and the motor 904 rotates in the first motor direction by one step. The number of steps STP4 is stored by the processor 914 in the memory device 916.

A hard stop position is achieved at the position P5. For example, the plates 912A and 912B cannot be moved any closer to each other when they are at the position P5, which is an example of a perpendicular distance between the plates 912A and 912B.

The processor 914 compares the number of steps STP4 for which the position P5 is achieved instead of achieving the home position HP1 with the number of steps STP1 to achieve the home position HP1, as illustrated with reference to FIG. 9A, to determine whether the number STP4 is within the tolerance T of the number STP1. For example, the processor 914 determines whether the number STP4 matches the number STP1. Upon determining that the number STP4 is outside the tolerance T or not less than the tolerance T from the number STP1, the processor 914 updates or increments the count from 1 to 2. For example, the processor 914 determines that the difference between the numbers STP4 and STP1 or STP1 and STP4 is not less than the tolerance T to determine to increment the count by one. The count, such as two, is stored in the memory device 916 by the processor 914. As another example, the processor 914 is coupled to the counter and updates a count of the counter by one to achieve a count of two. The count of one corresponds to a first try or a first time and the count of 2 corresponds to a second try or a second time.

In this manner, the processor 914 updates the count by one each time the home position HP1 is not achieved using the motor 904 after reverting back STP1 steps. Instead of the home position HP1, another hard stop position is achieved each time. Each time the count is incremented, the processor 914 determines whether the count is less than the threshold m (FIG. 8). Upon determining that the count is less than the threshold m, the processor 914 controls the motor 904 to step back by the number STP1 of steps and then further controls the motor 904 to facilitate achieving the home position HP1. The processor 914 calculates a number of steps for achieving the home position HP1 or another hard stop position achieved instead of the home position HP1 and determines whether the number of steps matches or is within the tolerance from STP1. The processor continues to control the motor 904 to step back and to facilitate the variable capacitor 902 to achieve a hard stop position until the count is not less than the threshold m. Upon determining that the count is not less than the threshold m, e.g., is equal to or exceeds the threshold, the processor 914 determines that the failure condition associated with the variable capacitor 902 is achieved.

The processor 914 generates an alarm upon determining that the failure condition associated with the variable capacitor 902 is achieved. For example, the processor 914 generates image data indicating the failure condition and sends the image data to the display device 956. The display device 956 displays one or more images representing the failure condition based on the image data. As another example, the processor 914 accesses audio data indicating the failure condition from the memory device 916 and sends the audio data to the digital to analog converter 960. The digital to analog converter 960 converts the audio data from the digital format to an analog format to output an analog audio signal. The amplifier 962 changes a magnitude of the analog audio signal to output an amplified audio signal. The one or more speakers 964 receive the amplified audio signal to output sound indicating the failure condition.

When a user views the representation of the failure condition displayed on the display device 956 and/or hears the sound indicating the failure condition, the user accesses the variable capacitor 902 from the high frequency matching network 408 (FIG. 4) or the low frequency matching network 406 (FIG. 4) or the combiner and distributor 121 (FIG. 4) or the impedance matching network 614 (FIG. 6). The user replaces the variable capacitor 902 with another variable capacitor that is functional. In addition to or instead of the variable capacitor 904, the user may grease the lead screw 910 or replace the lead screw 910 or grease the connection mechanism 914 or replace the connection mechanism 914 or replace the motor 904 or replace the driver 906 or a combination thereof.

It should further be noted that the plates 912A and 912B move in the first linear direction in response to the instruction signal 950 and the first linear direction is opposite to the second linear direction. The plates 912A and 912B move in the second linear direction in response to the instruction signal 944 (FIG. 9E).

In one embodiment, the method operations are described with reference to FIGS. 9A-9F are performed before processing of the substrate S within any of the stations 1 through 4 (FIG. 4) or within the plasma chamber 618 (FIG. 6). For example, each time the high frequency matching network 408 or the low frequency matching network 406 or the combiner and distributor 121 (FIG. 4) or the impedance matching network 614 (FIG. 6) is turned on or powered on, the method operations are performed to determine whether the failure condition is achieved and to indicate the failure condition.

In one embodiment, instead of the processor 914 counting a number of steps, such as STP1, STP2, STP3, or STP4, a motor encoder is coupled to the motor 904. The motor encoder counts the number of steps. The number of steps counted by the motor encoder is provided from the motor encoder to the processor 914.

Figure 10:
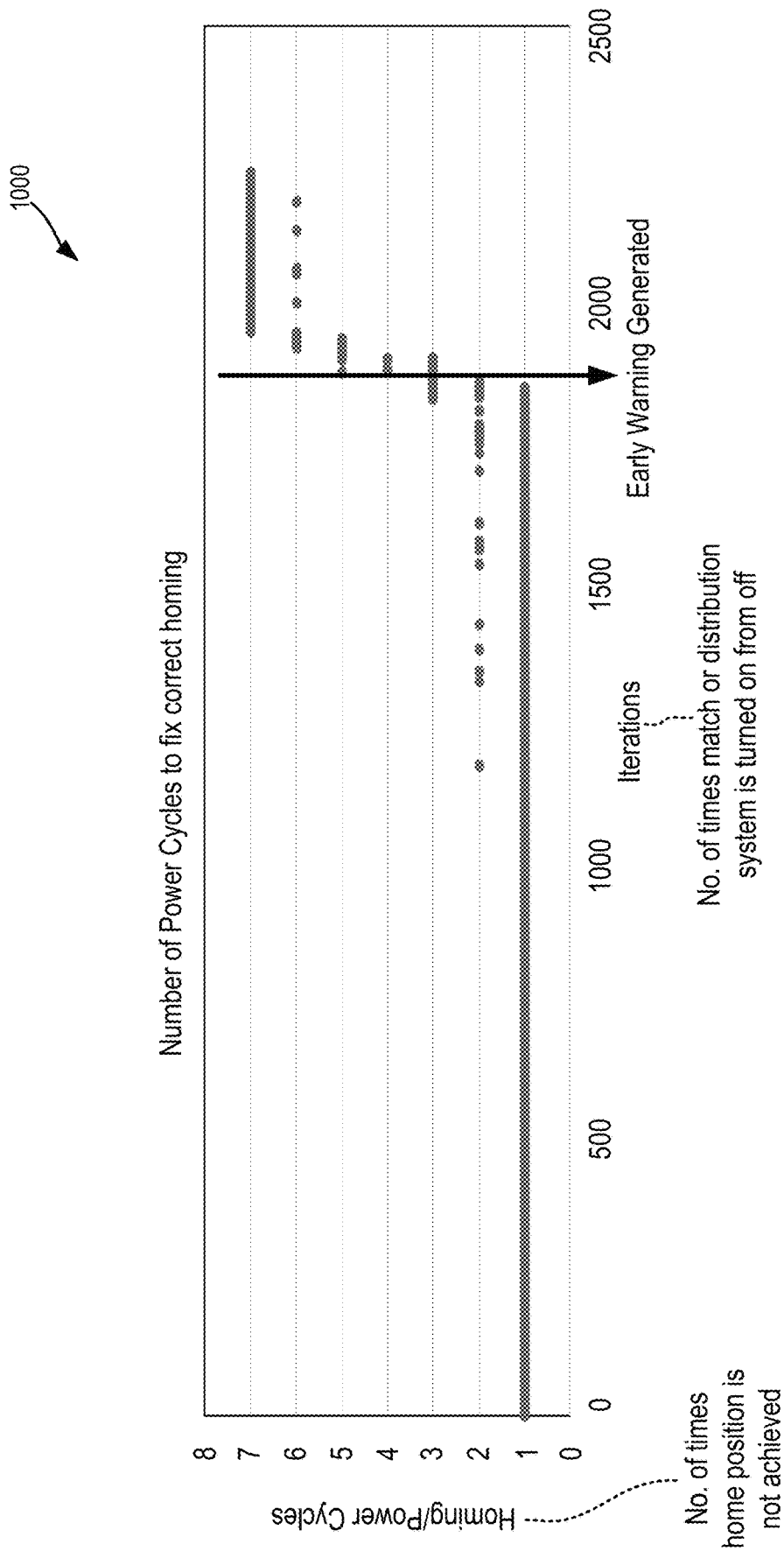
FIG. 10 is an embodiment of a graph to illustrate a number of homing or power cycles versus a number of iterations of turning off and on an impedance matching circuit or a combiner and distributor.

FIG. 10 is an embodiment of a graph 1000 to illustrate a number of homing or power cycles versus a number of iterations. The number of homing or power cycles is equal to the count that is described above. The number of iterations is a number of times the high frequency matching network 408 (FIG. 4) or the low frequency matching network 406 (FIG. 4) or the combiner and distributor 121 (FIG. 4) or the impedance matching network 614 (FIG. 6) in which the variable capacitor 902 (FIG. 9A) is located is turned on or off. As illustrated in the graph 1000, until the number of iterations is approximately 1800, the count is equal to one. When the number of iterations exceed 1800 or so, the count increases exponentially from one to seven. The increase in the count generates the alarm indicating the failure condition associated with the variable capacitor 902 and the variable capacitor 902 is replaced by the user.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for determining a failure condition associated with a capacitor, comprising:

controlling a motor for a first time to move the capacitor to a home position, wherein at the home position, the capacitor has a highest capacitance or a lowest capacitance from a plurality of capacitances of the capacitor;

recording, within a memory device, a first number of steps the motor took to move the capacitor to the home position;

instructing the motor for the first time to move in reverse by the first number of steps;

computing a second number of steps taken by the motor when the motor operates to move the capacitor for the first time to a position associated with a hard stop after the reversal, wherein the capacitor cannot move beyond the position associated with the hard stop;

determining that the second number of steps is outside a preset range from the first number of steps;

incrementing a count for the first time upon determining that the second number of steps is outside the preset range from the first number of steps; and repeating said instructing, computing, determining, and incrementing upon determining that the second number of steps is outside the preset range from the first number of steps, wherein said repeating includes:

instructing the motor for a second time to move in reverse by the first number of steps;

computing a third number of steps taken by the motor when the motor operates to move the capacitor for the second time to a position associated with the hard stop after the reversal;

determining that the third number of steps is outside the preset range from the first number of steps; and incrementing the count for the second time upon determining that the third number of steps is outside the preset range from the first number of steps, wherein said repeating is performed until the count is at least equal to a threshold indicative of the failure condition associated with the capacitor.

2. The method of claim 1, wherein said controlling the motor, said recording the first number of steps, said instructing the motor for the first time, said computing the second number of steps, said determining that the second number of steps is outside the preset range, said incrementing the count for the first time, and said repeating said instructing, computing, determining, and incrementing are performed before processing a substrate.

3. The method of claim 1, wherein when the capacitor is at the position associated with the hard stop, the capacitor cannot operate, and wherein the home position is different from the position associated with the hard stop.

4. The method of claim 1, wherein the hard stop is reached when the motor cannot operate.

5. The method of claim 1, wherein said instructing the motor to move in reverse by the first number of steps includes controlling a power supply to reverse a direction of a power signal that is supplied to the motor, wherein the power supply is coupled to the motor via a driver.

6. The method of claim 1, wherein the capacitor is located within an impedance matching network.

7. The method of claim 1, wherein the capacitor is located within a combiner and distributor.

8. The method of claim 1, wherein the failure condition includes damage to a lead screw, coupler or other drive system component that is associated with a plate of the capacitor.

9. The method of claim 1, wherein the threshold ranges from and including four to seven.

10. A system controller for determining a failure condition associated with a capacitor, comprising:
a memory device; and
a processor coupled to the memory device, wherein the processor is configured to:
control a motor for a first time to move the capacitor to a home position, wherein at the home position, the capacitor has a highest capacitance or a lowest capacitance from a plurality of capacitances of the capacitor;
record, within the memory device, a first number of steps the motor took to move the capacitor to the home position;
instruct the motor for the first time to move in reverse by the first number of steps;
compute a second number of steps when the motor operates to move the capacitor for the first time to a position associated with a hard stop after the reversal, wherein the capacitor cannot move beyond the position associated with the hard stop;
determine that the second number of steps is outside a preset range from the first number of steps;
increment a count for the first time upon determining that the second number of steps is outside the preset range from the first number of steps; and
repeat the instruction to the motor, the computation, the determination, and the increment upon determining that the second number of steps is outside the preset range from the first number of steps,
wherein to repeat, the processor is configured to:
instruct the motor for a second time to move in reverse by the first number of steps;
compute a third number of steps taken by the motor when the motor operates to move the capacitor for the second time to a position associated with the hard stop after the reversal;
determine that the third number of steps is outside the preset range from the first number of steps; and
increment the count for the second time upon determining that the third number of steps is outside the preset range from the first number of steps,
wherein the repetition is performed until the count is at least equal to a threshold indicative of the failure condition associated with the capacitor,
wherein the memory device is configured to store the second number of steps.

11. The system controller of claim 10, wherein the processor is configured to achieve the control of the motor for the first time, record the first number of steps, send the instruction to the motor for the first time, compute the second number of steps, determine that the second number of steps is outside the preset range, increment the count for the first time, and perform the repetition before processing a substrate.

12. The system controller of claim 10, wherein when the capacitor is at the position associated with the hard stop, the capacitor cannot operate, and wherein the home position is different from the position associated with the hard stop.

13. The system controller of claim 10, wherein to instruct the motor to move in reverse by the first number of steps, the processor is configured to control a power supply to reverse a direction of a power signal that is supplied to the motor, wherein the power supply is coupled to the motor via a driver.

14. The system controller of claim 10, wherein the capacitor is located within a combiner and distributor.

15. The system controller of claim 10, wherein the capacitor is located within an impedance matching network.

16. The system controller of claim 10, wherein the failure condition includes damage to a lead screw, coupler or other drive system component that is associated with a plate of the capacitor.

17. The system controller of claim 10, wherein the threshold ranges from and including four to seven.

18. A plasma tool for determining a failure condition associated with a capacitor, comprising:
a first radio frequency (RF) power supply configured to generate a first RF signal;
a second RF power supply configured to generate a second RF signal;
a first matching network coupled to the first RF power supply to receive the first RF signal to output a first modified RF signal;
a second matching network coupled to the second RF power supply to receive the second RF signal to output a second modified RF signal;
a combiner and distributor coupled to the first matching network and the second matching network to receive the first modified RF signal and the second modified RF signal to output a plurality of output signals, wherein the combiner and distributor includes the capacitor;
a plurality of plasma stations coupled to the combiner and distributor to receive the plurality of output signals to process a plurality of substrates; and
a system controller coupled to the combiner and distributor, wherein the system controller includes:
a memory device; and
a processor coupled to the memory device, wherein the processor is configured to:
control a motor for a first time to move the capacitor to a home position, wherein at the home position, the capacitor has a highest capacitance or a lowest capacitance from a plurality of capacitances of the capacitor;
record, within the memory device, a first number of steps the motor took to move the capacitor to the home position;
instruct the motor for the first time to move in reverse by the first number of steps;
compute a second number of steps when the motor operates to move the capacitor for the first time to a position associated with a hard stop after the reversal, wherein the capacitor cannot move beyond the position associated with the hard stop;
determine that the second number of steps is outside a preset range from the first number of steps;
increment a count for the first time upon determining that the second number of steps is outside the preset range from the first number of steps; and
repeat the instruction to the motor, the computation, the determination, and the increment upon determining that the second number of steps is outside the preset range from the first number of steps,
wherein to repeat, the processor is configured to:
instruct the motor for a second time to move in reverse by the first number of steps;
compute a third number of steps taken by the motor when the motor operates to move the capacitor for the second time to a position associated with the hard stop after the reversal;
determine that the third number of steps is outside the preset range from the first number of steps; and increment the count for the second time upon determining that the third number of steps is outside the preset range from the first number of steps, wherein the repetition is performed until the count is at least equal to a threshold indicative of the failure condition associated with the capacitor, wherein the memory device is configured to store the second number of steps.

19. The plasma tool of claim 18, wherein the processor is configured to achieve the control of the motor for the first time, record the first number of steps, send the instruction to the motor for the first time, compute the second number of steps, determine that the second number of steps is outside the preset range, increment the count for the first time, and perform the repetition before processing the plurality of substrates.

\* \* \* \* \*